(12) United States Patent
Hagiwara et al.

(10) Patent No.: US 7,643,325 B2
(45) Date of Patent: Jan. 5, 2010

(54) FERROELECTRIC MEMORY AND OPERATING METHOD OF SAME

(75) Inventors: Shingo Hagiwara, Kawasaki (JP); Yoshiaki Kaneko, Kawasaki (JP); Amane Inoue, Kawasaki (JP); Akihito Kumagai, Kawasaki (JP); Isao Fukushi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 299 days.

(21) Appl. No.: 11/896,343

(22) Filed: Aug. 31, 2007

(65) Prior Publication Data

US 2008/0175034 A1 Jul. 24, 2008

(30) Foreign Application Priority Data

Nov. 29, 2006 (JP) ............................. 2006-321775

(51) Int. Cl.
*G11C 11/22* (2006.01)
(52) U.S. Cl. ....................................... 365/145; 365/222
(58) Field of Classification Search ................. 365/145, 365/222
See application file for complete search history.

(56) References Cited

U.S. PATENT DOCUMENTS

2004/0219740 A1* 11/2004 Nishihara .................... 438/232

FOREIGN PATENT DOCUMENTS

| JP | 6-215589 A | 8/1994 |
| JP | 7-226086 A | 8/1995 |
| JP | 10-21689 A | 1/1998 |

* cited by examiner

*Primary Examiner*—Vu A Le
(74) *Attorney, Agent, or Firm*—Arent Fox LLP

(57) ABSTRACT

A nonvolatile decision memory unit stores decision data indicating whether data stored in the normal memory cells is true or false. An inversion control circuit sets the inverting signal to a valid level with a predetermined probability. A write circuit writes data having logic which is inverse logic of data to be rewritten to the normal memory cells and writes decision data indicating false to the decision memory unit when the inverting signal indicates a valid level. Since inverse data is rewritten at a predetermined frequency, an imprint is prevented when a read operation is executed repetitively. Moreover, since frequent repeating of reverse polarization of the ferroelectric capacitor due to a rewrite operation is prevented, deterioration of the ferroelectric capacitor due to reverse polarization is minimized. Thus, occurrence of the imprint and deterioration of characteristics in the ferroelectric capacitor is prevented, and the reliability of the ferroelectric memory is improved.

16 Claims, 17 Drawing Sheets

| | WROP | | RDOP | | | | | | | | | | | |
|---|---|---|---|---|---|---|---|---|---|---|---|---|---|---|
| | | | OUT | REWR | REWR | OUT | REWR | REWR | OUT | REWR | REWR | OUT | REWR | REWR |
| I/O<br>RVS | 0<br>1 | 1<br>— | 0<br>1 | —<br>0 | —<br>1 | 1<br>— | —<br>0 | —<br>1 | 1<br>— | —<br>0 | —<br>1 | 0<br>1 | —<br>0 | —<br>1 |
| WA<br>DWA | 0<br>0 | 1<br>0 | —<br>— | 0<br>0 | 1<br>1 | —<br>— | 1<br>0 | 0<br>1 | —<br>— | 1<br>0 | 0<br>1 | —<br>— | 0<br>0 | 1<br>1 |
| SA (MC)<br>(DMC) | —<br>— | —<br>— | 0<br>0 | —<br>— | —<br>— | 1<br>0 | —<br>— | —<br>— | 0<br>1 | —<br>— | —<br>— | 1<br>1 | —<br>— | —<br>— |
| MC<br>DMC | →<br>0<br>0 | →<br>1<br>0 | ←<br>0<br>0 | →<br>0<br>0 | →<br>1<br>1 | ←<br>1<br>0 | →<br>1<br>0 | →<br>0<br>1 | ←<br>0<br>1 | →<br>1<br>0 | →<br>0<br>1 | ←<br>1<br>1 | →<br>0<br>0 | →<br>1<br>1 |

FERROELECTRIC MEMORY AND OPERATING METHOD OF SAME

CROSS REFERENCE TO RELATED APPLICATION

This application is based upon and claims the benefit of priority from Japanese Patent Application No. 2006-321775, filed on Nov. 29, 2006, the entire contents of which are incorporated herein by reference.

TECHNICAL FIELD

The present invention relates to a ferroelectric memory having memory cells made of ferroelectric capacitor.

BACKGROUND

Ferroelectric memories can retain data without a power supply, by operating their ferroelectric capacitors as variable capacitors and utilizing residual dielectric polarization remaining even after the voltages applied to the ferroelectric capacitors are removed.

In ferroelectric memories which store a binary value in one memory cell, a residual dielectric polarization value reverses by a read operation in a memory cell storing one of logical values (logic 1 for example). Accordingly, a rewrite operation is required for returning the residual dielectric polarization value to its original state after the read operation. On the other hand, in a memory cell storing the other one of the logical value (logic 0 for example), a residual dielectric polarization value does not reverse after a read operation. In general, in the case where a logical value, for which a residual dielectric polarization value does not reverse after a read operation, is stored in a memory cell, an imprint occurs by repeating the read operation. The imprint is a phenomenon such that a characteristic of a ferroelectric capacitor deteriorates by applying a unidirectional voltage (stress) constantly to the ferroelectric capacitor, and thereby a hysteresis loop showing the characteristic of the ferroelectric capacitor is shifted to an axial direction of the voltage.

To prevent deterioration of the characteristic of a ferroelectric capacitor by the imprint, there is proposed an approach to rewrite to a memory cell a logical value which is an inverse of the logical value read from a memory cell after every read operation (refer to, for example, Japanese Unexamined Patent Application Publication No. H07-226086). Further, to prevent deterioration of the characteristic of a ferroelectric capacitor due to reverse polarization (fatigue in a capacitor film), there is proposed an approach to selectively switch a plurality of memory areas to decrease the number of accesses to each ferroelectric memory cell (refer to, for example, Japanese Unexamined Patent Application Publication No. H10-21689). Moreover, there is proposed an approach to decrease the number of accesses to a ferroelectric memory cell by storing the same data in a ferroelectric memory cell and a volatile memory cell (refer to, for example, Japanese Unexamined Patent Application Publication No. H06-215589).

However, when the logical value stored in a memory cell reverses after every rewrite operation, the polarity of the residual dielectric polarization value of a ferroelectric capacitor reverses after every read operation. The imprint can be prevented by repeating reversing of the polarization state, but the hysteresis loop decreases gradually. Thereby, the characteristic of the ferroelectric capacitor deteriorates, and the residual dielectric polarization decreases. In other words, a read margin of the ferroelectric memory cell decreases.

On the other hand, in the case of providing redundant memory areas for decreasing the number of accesses to a ferroelectric memory cell, the number of memory cells becomes double or more. Accordingly, the chip size of the ferroelectric memory increases significantly.

Thus, in prior art, there is a problem that imprint will occur in ferroelectric capacitors and that characteristics will deteriorate.

SUMMARY

A ferroelectric memory in accordance with various embodiments of the present invention rewrites inverse data at predetermined frequency.

BRIEF DESCRIPTION OF THE DRAWINGS

FIG. 6 is an explanatory diagram showing an overview of operations of an embodiment;

FIG. 14 is an explanatory diagram showing an overview of operations of another embodiment shown in FIG. 10;

DETAILED DESCRIPTION OF THE EMBODIMENTS

Figure 1:
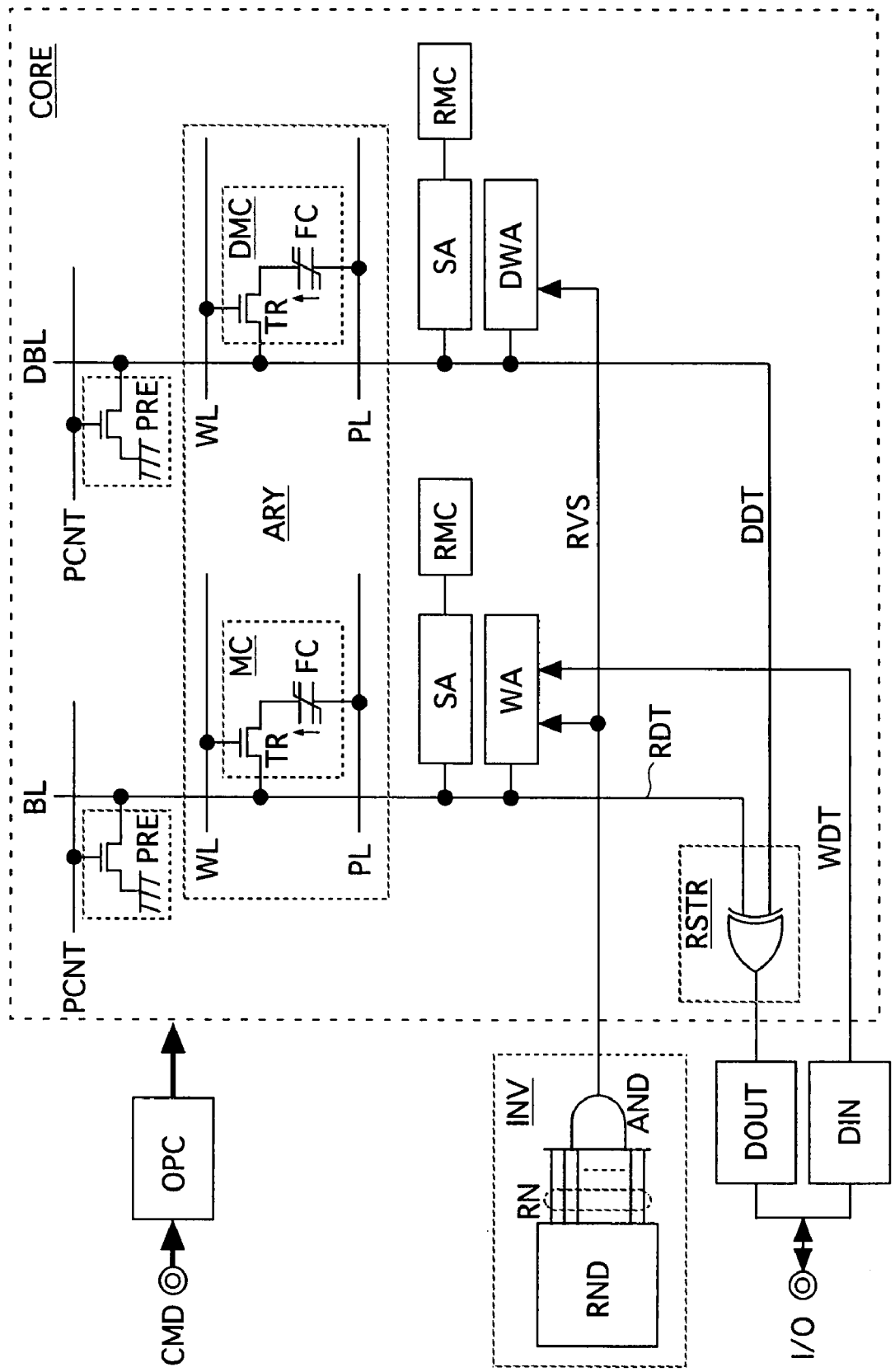
FIG. 1 is a block diagram showing an embodiment of the present invention.

Hereinafter, embodiments of the present invention will be described with reference to the drawings. In the drawings, each thick line represents a signal line that consists of a plurality of lines. Some of the blocks connected with the thick lines consist of a plurality of circuits each. Signal lines for transmitting signals are designated by the same reference symbols as the names of the signals. Double circles in the drawings represent external terminals. Except when refusing, same reference symbols represent same circuits or signals.

FIG. 1 shows an embodiment of the present invention. A ferroelectric memory has a memory core CORE, an operation control circuit OPC, an inversion control circuit INV, a data output circuit DOUT and a data input circuit DIN. The memory core CORE has a memory cell array ARY, a precharge circuit PRE, sense amplifiers SA, write amplifiers WA, DWA (write circuit), reference memory cells RMC and a data restoration circuit RSTR. In FIG. 1, only minimum circuits required for the present invention are shown. Accordingly, a circuit related to an address signal for selecting a memory cell MC is not shown. For example, the ferroelectric memory is formed as a single semiconductor chip, and is mounted as a work memory on a system of portable equipment or the like. In another way, the ferroelectric memory is mounted on a wireless tag.

The memory cell array ARY has normal memory cells MC and a decision memory cell DMC (decision memory unit). The normal memory cells MC store data supplied from the outside of the ferroelectric memory via a data terminal I/O. The decision memory cell DMC stores decision data DDT indicating whether data stored in the normal memory cells MC is true (correct) or false (inverted). Each of the memory cells MC, DMC has one transfer transistor TR and one ferroelectric capacitor FC. A memory cell of this type is referred to as 1T1C type. In the diagram, the direction of an arrow attached to a ferroelectric capacitor shows a polarization state. For example, an electrode on the tip side of an arrow is charged positively. In the transfer transistor TR, one of a source and a drain is connected to a bit line BL (or DBL), the other one of the source and the drain is connected to one end of the ferroelectric capacitor FC, and a gate is connected to a word line WL. The other end of the ferroelectric capacitor FC is connected to a plate line PL.

Note that the decision memory cell DMC may be designed to have the same structure (size, shape) and electric characteristics as those of the normal memory cells MC, and may have a different structure and electric characteristics as those of the normal memory cells MC. For example, when the memory cells MC, DMC have the same structures and characteristics, a word line WL and a plate line PL in common are connected to the memory cells MC, DMC. When the memory cells MC, DMC have different structures and different characteristics, independent word lines WL and plate lines PL are connected to the memory cells MC, DMC, respectively. Moreover, the memory cell DMC may be constructed using a non-volatile element other than the ferroelectric capacitor FC.

In general, in a ferroelectric memory, a plurality of memory cells MC are connected to one word line WL. In this case, for example, one decision memory cell DMC is arranged corresponding to a plurality of memory cells MC connected to each word line WL. Further, one decision memory cell DMC may be arranged corresponding to a plurality of memory cells MC connected to a plurality of word lines. The decision memory cell DMC is formed corresponding to at least one memory cell MC.

The precharge circuit PRE connects the bit line BL (or DBL) to a ground line when receiving a precharge control signal PCNT at a high logical level. Each sense amplifier SA amplifies the difference between the amount of a signal read from the memory cells MC (or DMC) to the bit line BL (or DBL) and the amount of a reference signal read from the reference memory cells RMC.

The write amplifier WA amplifies a write data signal WDT supplied via the data input circuit DIN during a write operation to write the write data signal WDT to the memory cells MC, and outputs the amplified signal to the normal bit line BL. Also, during a rewrite operation of data executed in a latter half of a read operation, the write amplifier WA inverts a read data signal RDT on the normal bit line BL amplified by the sense amplifier SA according to an inverting signal RVS, and outputs the inverted signal to the normal bit line BL. For example, the read data signal RDT is inverted when the inverting signal RVS is at a high logical level, but is not inverted when the inverting signal RVS is at a low logical level.

The write amplifier DWA outputs a low logical level to the decision bit line DBL during the write operation. Further, during the rewrite operation, the write amplifier DWA inverts a decision data signal DDT on the decision bit line DBL amplified by the sense amplifier SA according to the inverting signal RVS, and outputs the inverted signal to the bit line BL. For example, the decision data signal DDT is inverted when the inverting signal RVS is at a high logical level, but is not inverted when the inverting signal RVS is at a low logical level. Each reference memory cell RMC is connected to each sense amplifier SA. For example, the reference memory cell RMC has a ferroelectric capacitor larger in size than the memory cells MC so that characteristics thereof do not change.

The operation control circuit OPC outputs a control signal for controlling the write operation and the read operation on the ferroelectric memory to the memory core CORE according to a command signal CMD supplied via a command terminal CMD. The command signal CMD indicates one of read command, write command or standby command. The standby command is a command when an access command (read command or write command) is not supplied. An operation mode of the ferroelectric memory is set to a standby mode while the standby command is received. The read operation includes a rewrite operation after reading of data.

Figure 4:
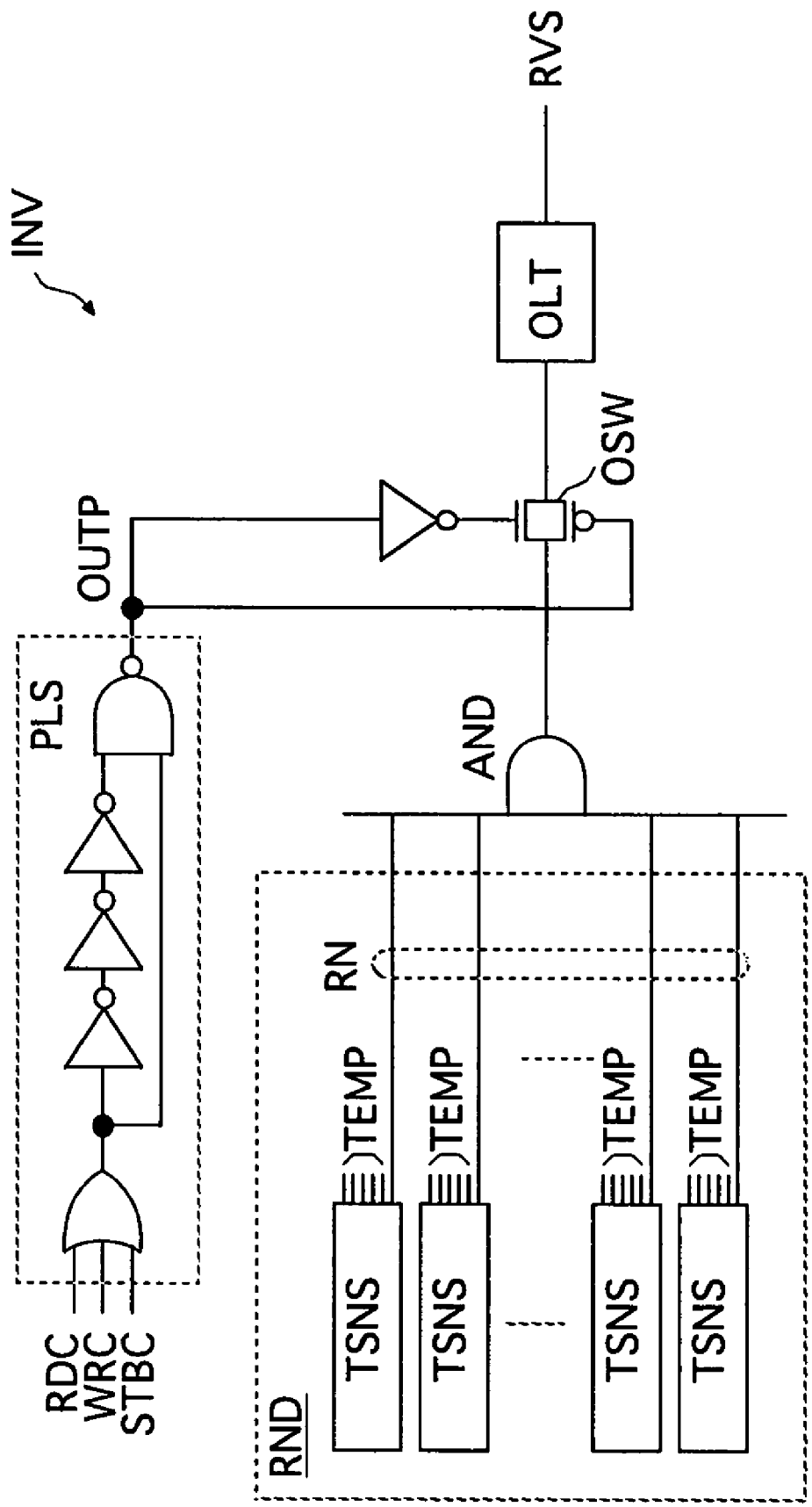
FIG. 4 is a block diagram showing details of an inversion control circuit shown in FIG. 1.

The inversion control circuit INV has a random-number generator RND and an AND gate (logic circuit). The random-number generator RND outputs a random-number signal RN at a high logical level (first logical level) by a probability of 1/2 for example to each of signal lines of a plurality of bits. The generation cycle of the random-number signal RN is substantially equal to cycles of a write operation WROP and a read operation RDOP in FIG. 5, which will be described later. Details of the random-number generator RND are shown in FIG. 4, which will be described later. The AND gate activates the inverting signal RVS to a high logical level (valid level) when all the random-number signals RN are at high logical levels, and inactivates the inverting signal RVS to a low logical level (invalid level) when any one of the random-number signals RN is at a low logical level.

For example, when the random-number signal RN is constituted of two bits, the probability that the inverting signal RVS turns to a high logical level is 0.25. In general, when assuming the number of bits of the random-number signal RN as n, the probability that the inverting signal RVS turns to a high logical level is $1/2^n$. The number of bits of the random-number signal RN may be one bit or larger. Note that the probability to output the random-number signal RN at a high logical level is not limited to 1/2, and may be a predetermined probability larger than 0 and smaller than 1. Further, a probability that the inverting signal RVS of a high logical level is set to a high logical level is not limited to 0.25, and may be a probability larger than 0 and smaller than 1.

The data restoration circuit RSTR is constituted of an EOR circuit. During a read operation on the ferroelectric memory, the data restoration circuit RSTR performs an EOR operation of logic of the read data signal RDT read via the bit line BL and logic of the decision data signal DDT read via the decision bit line DBL, and outputs an operation result to the data output circuit DOUT. The data output circuit DOUT outputs a read data signal from the data restoration circuit RSTR to the data terminal I/O (external terminal) during the read operation.

The decision data signal DDT at a high logical level indicates that data stored in the normal memory cells MC is false (inverted). The decision data signal DDT at a low logical level indicates that the data stored in the normal memory cells MC is true (proper). Accordingly, when the decision data signal DDT is at a high logical level, a signal which is an inverse of the logic of the read data signal RDT is outputted to the data terminal I/O. When the decision data signal DDT is at a low logical level, the logic of the read data signal RDT is outputted to the data terminal I/O without being inverted. The data input circuit DIN outputs the write data signal WDT supplied to the data terminal I/O to the write amplifier WA during a write operation on the ferroelectric memory.

Note that the structure shown in FIG. 1 shows a smallest structure for realizing the present invention. For example, when the ferroelectric memory has the data terminal I/O of eight bits, it requires eight data output circuits DOUT, eight data input circuits DIN, eight data restoration circuits RSTR, at least eight normal bit lines BL, and sense amplifiers SA, write amplifiers WA which are connected to the respective normal bit lines BL. At least one of each of the decision memory cell DMC, the decision bit line DBL, and the sense amplifier SA, write amplifier DWA connected to the decision bit line DBL may be provided in the memory cell array ARY.

Figure 2:
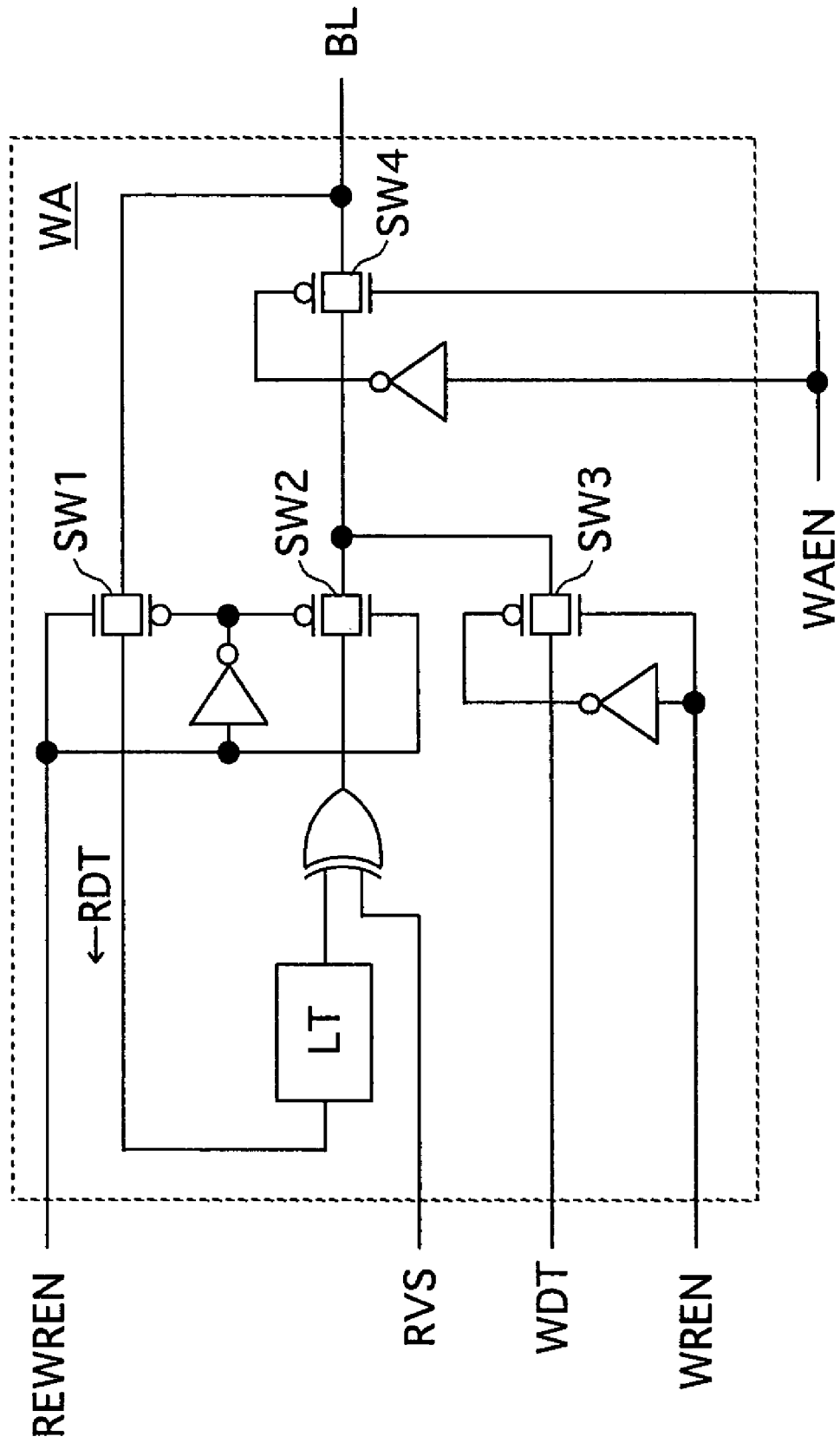
FIG. 2 is a block diagram showing details of a write amplifier WA shown in FIG. 1.

FIG. 2 shows details of the write amplifier WA shown in FIG. 1. The write amplifier WA has a latch LT, an EOR gate, and switches SW1, SW2, SW3, SW4. The switches SW1-SW4 are each constituted of, for example, a CMOS transmission gate. The switches SW1, SW2 turn on in synchronization with a rewrite enable signal REWREN which is activated to a high logical level during a rewrite operation. The switch SW3 turns on in synchronization with a write enable signal WREN which is activated to a high logical level during a write operation. The switch SW4 turns on in synchronization with a write amplifier enable signal WAEN which turns on during the write operation or the rewrite operation.

In a write operation, the write data signal WDT is supplied to the bit line BL via the switches SW3, SW4 and written to the memory cells MC. In a read operation, the read data signal RDT on the bit line BL which is amplified by the sense amplifier SA is latched to the latch LT via the switch SW1. The EOR gate performs an EOR operation of the output of the latch LT and the inverting signal RVS in the rewrite operation during a read operation, and outputs an operation result to the bit line BL via the switches SW2, SW4. When the inverting signal RVS is at a high logical level (valid level), the logical level of the read data signal RDT read to the bit line BL is inverted, and the inverted signal is written to the memory cells MC via the bit line BL. Further, when the inverting signal RVS is at a low logical level (invalid level), the logical level of the read data signal RDT read to the bit line BL is rewritten to the memory cells MC via the bit line BL.

Figure 3:
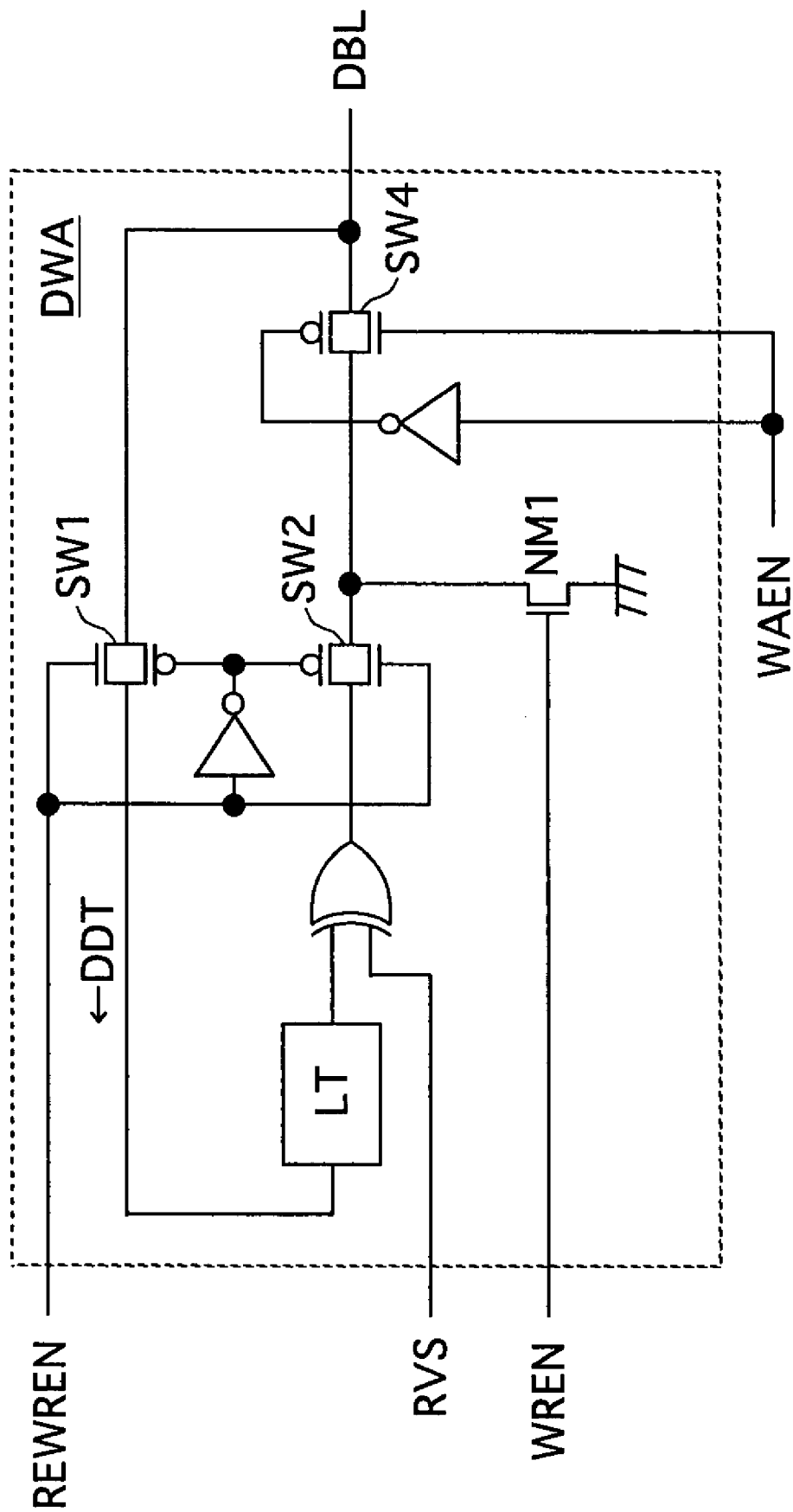
FIG. 3 is a block diagram showing details of a write amplifier DWA shown in FIG. 1.

FIG. 3 shows details of the write amplifier DWA shown in FIG. 1. The write amplifier DWA has the nMOS transistor NM1 instead of the switch SW3 of the write amplifier WA in FIG. 2. The nMOS transistor NM1 functions as a switch which connects the input node of the switch SW4 to the ground line. The other structure is the same as the write amplifier WA. The nMOS transistor NM1 turns on in synchronization with the write enable signal WREN which is activated to a high logical level during a write operation. Turning on of the nMOS transistor NM1 connects the decision bit line DBL to the ground line via the switch SW4. Specifically, in a write operation, the data signal at a low logical level is always written to the decision memory cell DMC.

In the rewrite operation during a read operation, similarly to the write amplifier WA shown in FIG. 2, when the inverting signal RVS is at a high logical level (valid level), the logical level of the decision data signal DDT read to the decision bit line DBL is inverted (indicating false), and the inverted signal is written to the decision memory cell DMC via the decision bit line DBL. Further, when the inverting signal RVS is at a low logical level (invalid level), the logical level (indicating true) of the decision data signal DDT read to the decision bit line DBL is rewritten to the decision memory cell DMC via the decision bit line DBL. Note that as shown in FIG. 6 which will be described later, in the rewrite operation, the logical level written to the decision memory cell DMC is always the same as the logical level of the inverting signal RVS. Accordingly, the switch SW1, the latch LT and EOR gate may be deleted from the write amplifier DWA so as to supply the inverting signal RVS to the switch SW2 directly.

FIG. 4 shows details of the inversion control circuit INV shown in FIG. 1. The inversion control circuit INV has the random-number generator RND, the AND gate, which are shown in FIG. 1, a pulse generating circuit PLS, an output switch OSW and an output latch OLT. The random-number generator RND has a plurality of temperature sensors TSNS corresponding to bits of the random-number signal RN respectively. Typically, the temperature sensors TSNS output a temperature signal TEMP of a plurality of bits indicating a tip temperature. In this embodiment, the random-number signal RN is generated using a further lower bit (invalid bit) than the least significant bit of the temperature signal TEMP outputted by the temperature sensors TSNS. The invalid bit is out of the number of valid digits (accuracy) of the temperature sensors TSNS. Accordingly, the value (high logical level or low logical level) thereof is a random value irrelevant to the chip temperature. Further, the probability that the random-number signal RN turns to a high logical level or a low logical level is equal (=0.5). Accordingly, as described above, the probability that the inverting signal RVS turns to a high logical level becomes $1/2^n$, where n is the number of bits of the random-number signal RN. The generation cycle of the random-number signal RN is, for example, controlled by a not-shown timer, and set equal to the cycle of the timer.

Note that the number of random-number generators RND formed in the inversion control circuit INV may be at least one. When the inversion control circuit INV has one random-number generator RND, the probability that the inverting signal RVS turns to a high logical level is 0.5. Further, when the ferroelectric memory is of a clock synchronization type, the random-number signal RN may be generated in synchronization with the clock.

The pulse generating circuit PLS generates an output control pulse OUTP in synchronization with the start of supplying a read command signal RDC, a write command signal WRC or a standby command signal STBC. The read command signal RDC, the write command signal WRC or the standby command signal STBC is generated by decoding the command signal CMD. The read command signal RDC is activated to a high logical level when a read operation is executed. The write command signal WRC is activated to a high logical level when a write operation is executed. The standby command signal STBC is activated to a high logical level when an access command signal (read command signal RDC or write command signal WRC) is not supplied.

The output switch OSW turns on when the output control pulse OUTP is at a low logical level, and connects the output of the AND gate to the input of the output latch OLT. The output latch OLT latches the logical level of a signal outputted from the AND gate during a period that the output control pulse OUTP is at the low logical level, and outputs the latched signal as the inverting signal RVS. Note that when the random-number signal RN is outputted in synchronization with the operation cycle of the ferroelectric memory, the pulse generating circuit PLS, the output switch OSW and the output latch OLT are not required.

Figure 5:
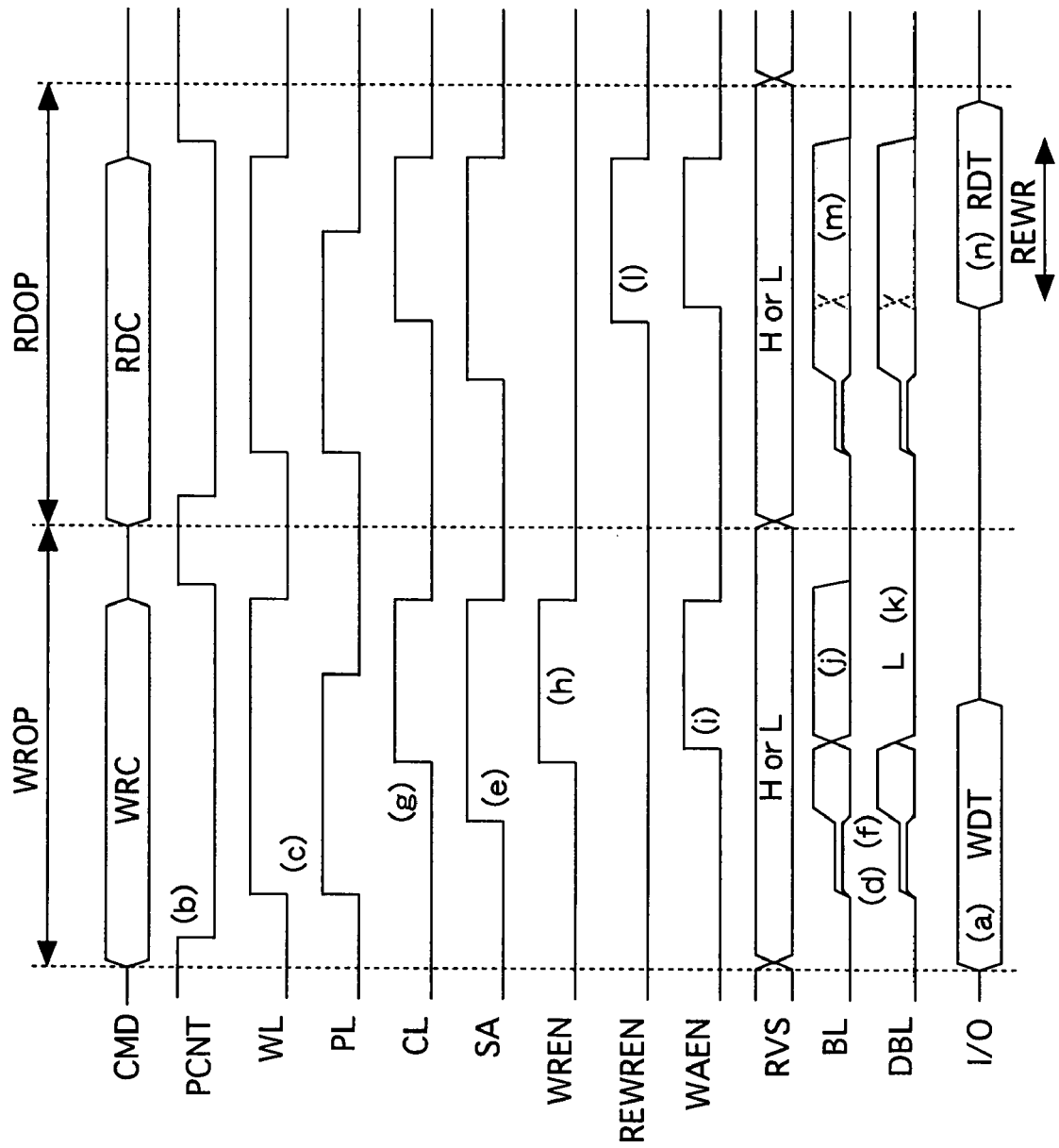
FIG. 5 is a timing diagram showing an example of operations of an embodiment.

FIG. 5 shows an example of operations of the embodiment on FIGS. 1-4. In this embodiment, the write command WRC and the read command RDC are supplied sequentially, and a write operation WROP and a read operation RDOP are executed. The write operation WROP and the read operation RDOP are controlled by the operation control circuit OPC shown in FIG. 1.

In the write operation WROP, write data WDT is supplied together with the write command WRC (FIG. 5(a)). The precharge control circuit PCNT is inactivated, and connections of the bit lines BL, DBL and the ground line are released (FIG. 5(b)). Next, the word line WL and the plate line PL are activated (FIG. 5(c)), and a charge (voltage) according to the residual dielectric polarization in the ferroelectric capacitor FC is read to the bit lines BL, DBL (FIG. 5(d)). Simultaneously, a reference charge (voltage) is read from the reference memory cell RMC. Next, the sense amplifier SA starts to operate (FIG. 5(e)), and voltages on the bit lines BL, DBL are amplified (FIG. 5(f)).

Next, a not-shown column switch CL turns on (FIG. 5(g)), and the write data signal WDT is supplied to the write amplifier WA. Thereafter, the write enable signal WREN and the write amplifier enable signal WAEN are activated (FIG. 5(h, i)). The write data signal WDT is supplied to the bit line BL, and the logical value thereof is written to the memory cells MC (FIG. 5(j)). Further, as explained in FIG. 3, the data signal at a low logical level L is written to the decision memory cell DMC (FIG. 5(k)).

In the read operation RDOP, operation timing of the precharge control signal PCNT, the word line WL, the plate line PL, the column switch CL, the sense amplifier SA and the write amplifier enable signal WAEN is the same as in the write operation WROP. Further, the operation from operating of the sense amplifier SA to amplifying of the voltages of the bit lines BL, DBL is the same as in the write operation WROP except that the write data signal WDT is not supplied.

In the read operation RDOP, after the voltages of the read data signal RDT and the decision data signal DDT read from the memory cells MC, DMC to the bit lines BL, DBL are amplified by the sense amplifier SA, the rewrite enable signal REWREN is activated before the write amplifier enable signal WAEN is activated (FIG. 5(l)). During the active period of the rewrite enable signal REWREN indicates a period of a rewrite operation REWR. Then, when the inverting signal RVS is at a high logical level H, the read data signal RDT and the decision data signal DDT on the bit lines BL, DBL are inverted and written to the memory cells MC, DMC, respectively (FIG. 5(m)). When the inverting signal RVS is at a low logical level L, the read data signal RDT and the decision data signal DDT amplified on the bit lines BL, DBL are rewritten to the memory cells MC, DMC, respectively, without being inverted.

As described above, the low logical level of the decision data signal DDT read from the decision memory cell DMC indicates that the read data signal RDT is true, and the high logical level of the decision data signal DDT indicates that the read data signal RDT is false (=inverted). In this manner, the decision memory cell DMC functions as a nonvolatile decision memory unit to store the decision data signal DDT which indicates whether the data stored in the memory cells MC is true or false.

Next, by the data restoration circuit RSTR, the logic of the read data signal on the normal bit line BL and the logic of the decision data signal DDT on the decision bit line DBL are EOR operated, and an operation result is outputted as the read data signal RDT to the data terminal I/O (FIG. 5(n)).

FIG. 6 shows an overview of operations of the embodiment on FIGS. 1-4. A downward arrow in the diagram indicates writing of a data signal to the memory cells MC, DMC. An upward arrow in the diagram shows reading of a data signal from the memory cells MC, DMC. The read operation RDOP is constituted of an output operation OUT of a read data signal and a rewrite operation REWR.

In the write operation WROP, the data signal (high logical level (logic 1) or low logical level (logic 1)) supplied from the data terminal I/O is amplified by the write amplifier WA and written to the memory cells MC. The write amplifier DWA always amplifies a signal of logic 0 and writes the amplified signal to the decision memory cell DMC. In the write operation WROP in this embodiment, the inverting signal RVS is not used. Further, in the write operation WROP, the logic of a signal written to the memory cells MC, DMC is irrelevant to the logic of a signal amplified in the sense amplifier SA initially in the write operation WROP.

The read operation RDOP is categorized into four types according to the logic of a data signal, "00", "10", "01", "11", (in the field of the output operation OUT in the diagram) which is read from the memory cells MC, DMC. When the decision data signal DDT read from the memory cell DMC has a logic 1, the read data signal RDT is false, and it is necessary to invert the logical level thereof. When the decision data signal DDT read from the memory cell DMC has a logic 0, the read data signal RDT is true, and it is not necessary to invert the logical level thereof.

The data signals read from the memory cells MC, DMC are amplified in the sense amplifier SA and thereafter subjected to an EOR operation, and then outputted to the data terminal I/O (output operation OUT. In the output operation OUT, the inverting signal RVS is not used. Next, EOR operations of the data signals read from the memory cells MC, DMC and the inverting signal RVS are performed by the write amplifiers WA, DWA, respectively, and operation results are rewritten to the memory cells MC, DMC (rewrite operation REWR).

Figure 7:
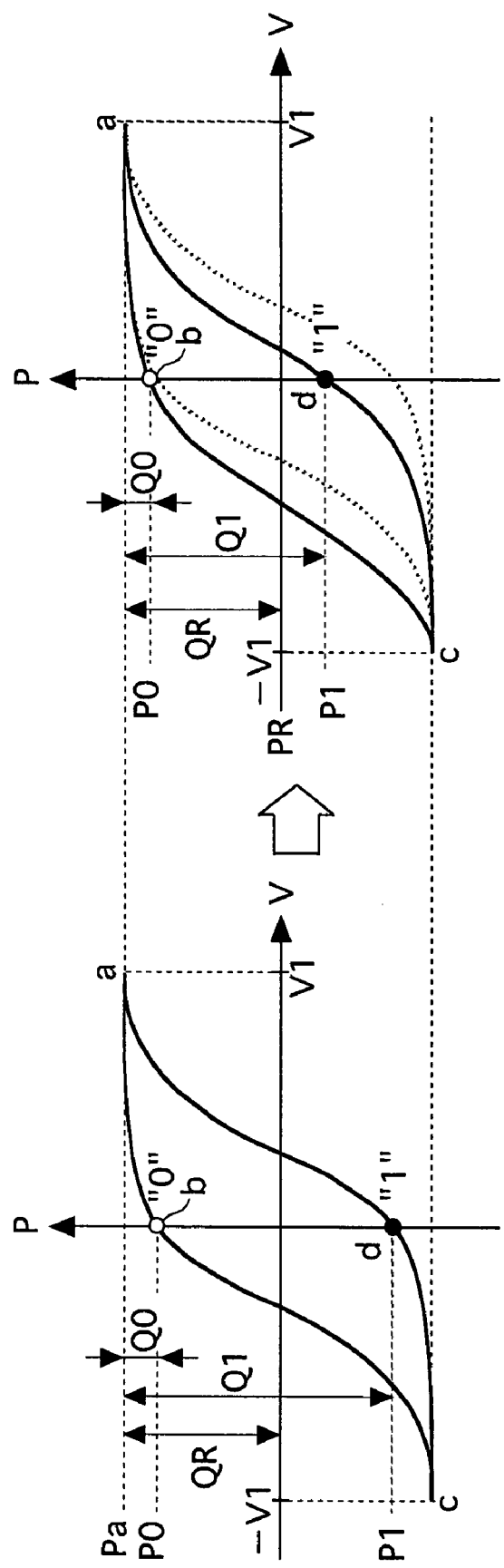
FIG. 7 is an explanatory diagram showing hysteresis characteristics of a ferroelectric capacitor FC.

FIG. 7 shows hysteresis characteristics of the ferroelectric capacitor FC. A hysteresis loop on the left side of the diagram shows a normal state that an imprint is not generated. A hysteresis loop on the right side of the diagram shows a state that an imprint is generated. A hysteresis loop shown by a dashed line on the right side of the diagram is the same as the hysteresis loop on the left side of the diagram. The horizontal axes show voltages V applied to the ferroelectric capacitor FC, and the vertical axes show dielectric polarization values P. The voltages V show voltages VPL (VBL-VPL) on the plate line PL with respect to the voltage VBL on the bit line BL (or DBL). In FIG. 7, the operation of the normal memory cells MC is explained. The operation of the decision memory cell DMC is explained by replacing the bit line BL with the decision bit line DBL.

Writing of a logic 0 is executed by setting of the bit line BL to 0 V and setting of the plate line PL to a voltage V1. At this time, the polarization value of the ferroelectric capacitor FC changes via the point a to the point b (white circle). On the other hand, writing of a logic 1 is executed by setting of the bit line BL to the voltage V1 and setting of the plate line PL to 0

V. At this time, the polarization point of the ferroelectric capacitor FC changes via the point c to the point d (black circle).

When data is read from the memory cells MC, the plate line PL is set to the voltage V1. A charge amount generated from the ferroelectric capacitor FC is Q0 corresponding to the difference between the polarization point Pa of the point a and the residual dielectric polarization point P0 for a logic 0. For a logic 1, the charge amount is Q1 corresponding to the difference between the polarization point Pa of the point a and the residual dielectric polarization point P1. The residual dielectric polarization value of the reference memory cell RMC is set between the value P0 and the value P1. Accordingly, the charge amount generated from the reference memory cell RMC in the read operation RDOP and the write operation WROP is QR. The sense amplifier SA reads data from the memory cells MC by amplifying a voltage difference corresponding to the difference of the charge amount (QR-Q0 or QR-Q1).

For example, in the case where a logic 0 is written to the memory cells MC and thereafter the logic 0 stored in the memory cells MC is read repetitively, the polarization state of the ferroelectric capacitor FC moves constantly between the point a and the point b. Thereby, a unidirectional voltage (stress) is applied constantly to the ferroelectric capacitor, and thus an imprint occurs. The hysteresis loop is distorted toward the side where the voltage V is low, as shown on the right side of the diagram. Accordingly, the difference between the residual dielectric polarization value P1 having a logic 1 and the residual dielectric polarization value of the reference memory cell RMC (corresponding to the voltage axis V) becomes small. As a result, in a memory cell MC in which the imprint has advanced, a read margin (QR-R1) in the case of writing a logic 1 becomes small, and a malfunction due to variation of power supply voltage, noise, or the like easily occurs. Specifically, a logic 0 is read with respect to an expected value of a logic 1.

In the present invention, in the case that a read operation of a logic 0 is executed repetitively, the logical value to be rewritten to the memory cells MC reverses at a predetermined frequency. Accordingly, repetitive reading of a logic 0 can be prevented, and thus occurrence of an imprint can be prevented. Moreover, by the operation of the inversion control circuit INV, the inversion of the logical value does not occur in every rewrite operation. Since frequent repeating of reverse polarization of the ferroelectric capacitor FC is prevented, deterioration of the ferroelectric capacitor FC due to reverse polarization can be minimized. As a result, the reliability of the ferroelectric memory can be improved.

In particular, in the memory cells MC of the 1T1C type, a read margin of a data signal can be easily affected by changes of characteristics of a hysteresis loop. Accordingly, by applying the present invention to a ferroelectric memory having memory cells of 1T1C type, significant effects can be obtained. On the other hand, in the 2T2C type in which each memory cell is constituted of two transfer transistors TR and two ferroelectric capacitors FC, complementary data signals are stored in a pair of ferroelectric capacitors. In a read operation on the 2T2C type memory cell, a charge amount (Q1-Q0) corresponding to a difference (point d−point b) between residual dielectric polarization values of the pair of ferroelectric capacitors is amplified, and read data is read. Accordingly, in the 2T2C type memory cell, a decrease amount of a read margin when the imprint has advanced is smaller as compared to the 1T1C type memory cell.

As above, in the embodiment, occurrence of an imprint can be prevented even when the read operation RDOP is executed repetitively, by generating the inverting signal RVS with a predetermined probability larger than 0 and smaller than 1, and inverting and rewriting the logic of the read data signal RDT with a predetermined frequency. Further, since the frequent repetition of reverse polarization of the ferroelectric capacitor FC by the rewrite operation REWR can be prevented, deterioration of the ferroelectric capacitor FC due to the reverse polarization can be minimized. As a result, the reliability of the ferroelectric memory can be improved.

Figure 8:
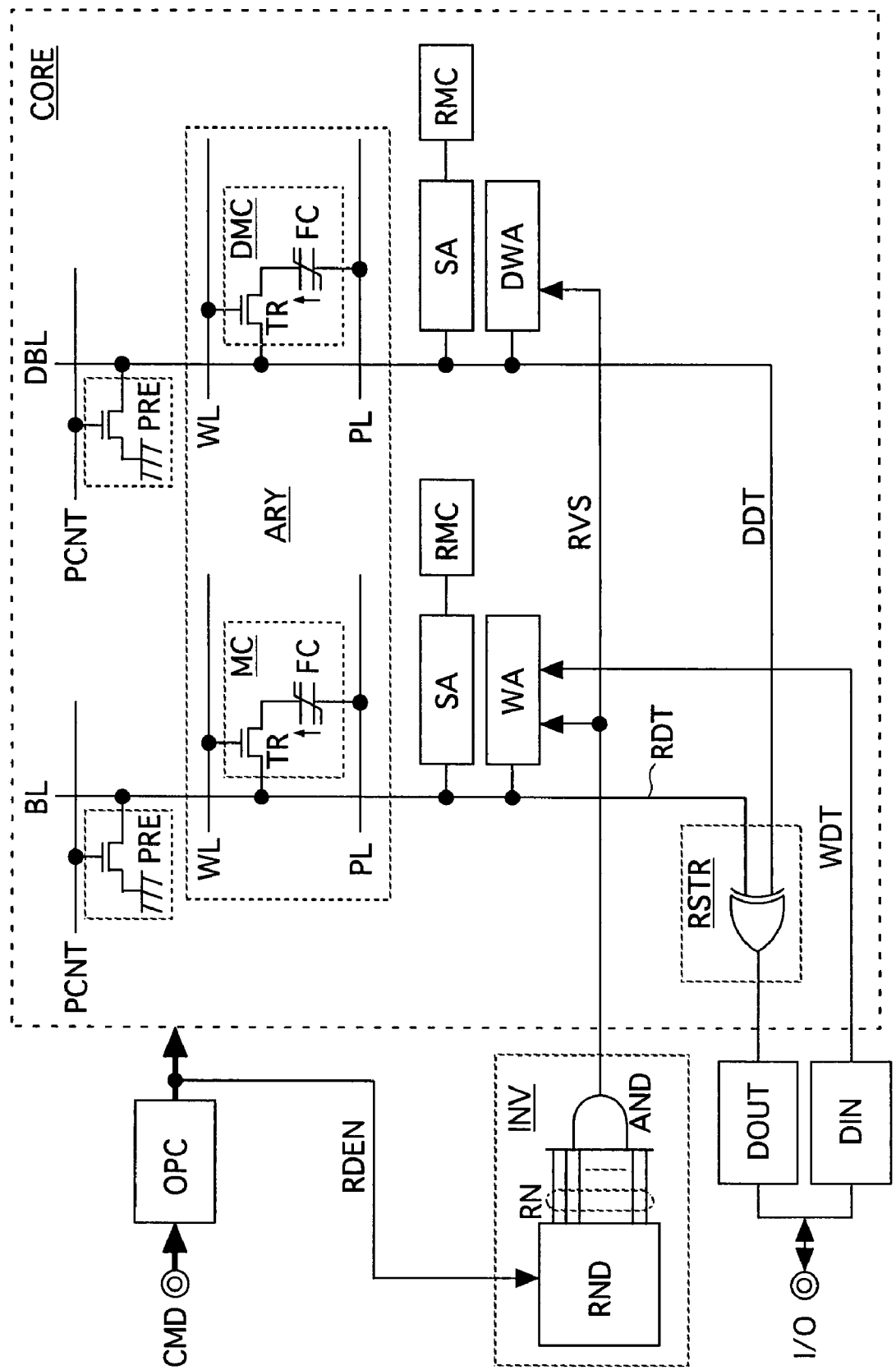
FIG. 8 is a block diagram showing another embodiment of the present invention.

FIG. 8 shows another embodiment of the present invention. The same elements as those explained in the embodiment on FIGS. 1-7 are designated the same symbols, and detailed explanations thereof are omitted. In this embodiment, the random-number generator RND is different from that of the embodiment on FIG. 1. The other structure is the same as in the embodiment on FIGS. 1-7. The decision memory cell DMC is formed corresponding to at least one memory cell MC.

Each random-number generator RND operates only during an active period of a read enable signal RDEN to generate the random-number signal RN. Each random-number generator RND stops to operate while the read enable signal RDEN is inactive, and connects a random-number signal line RN to the ground line. The read enable signal RDEN is outputted from the operation control circuit OPC in response to a command signal CMD (read command signal) showing a request for a read operation.

Figure 9:
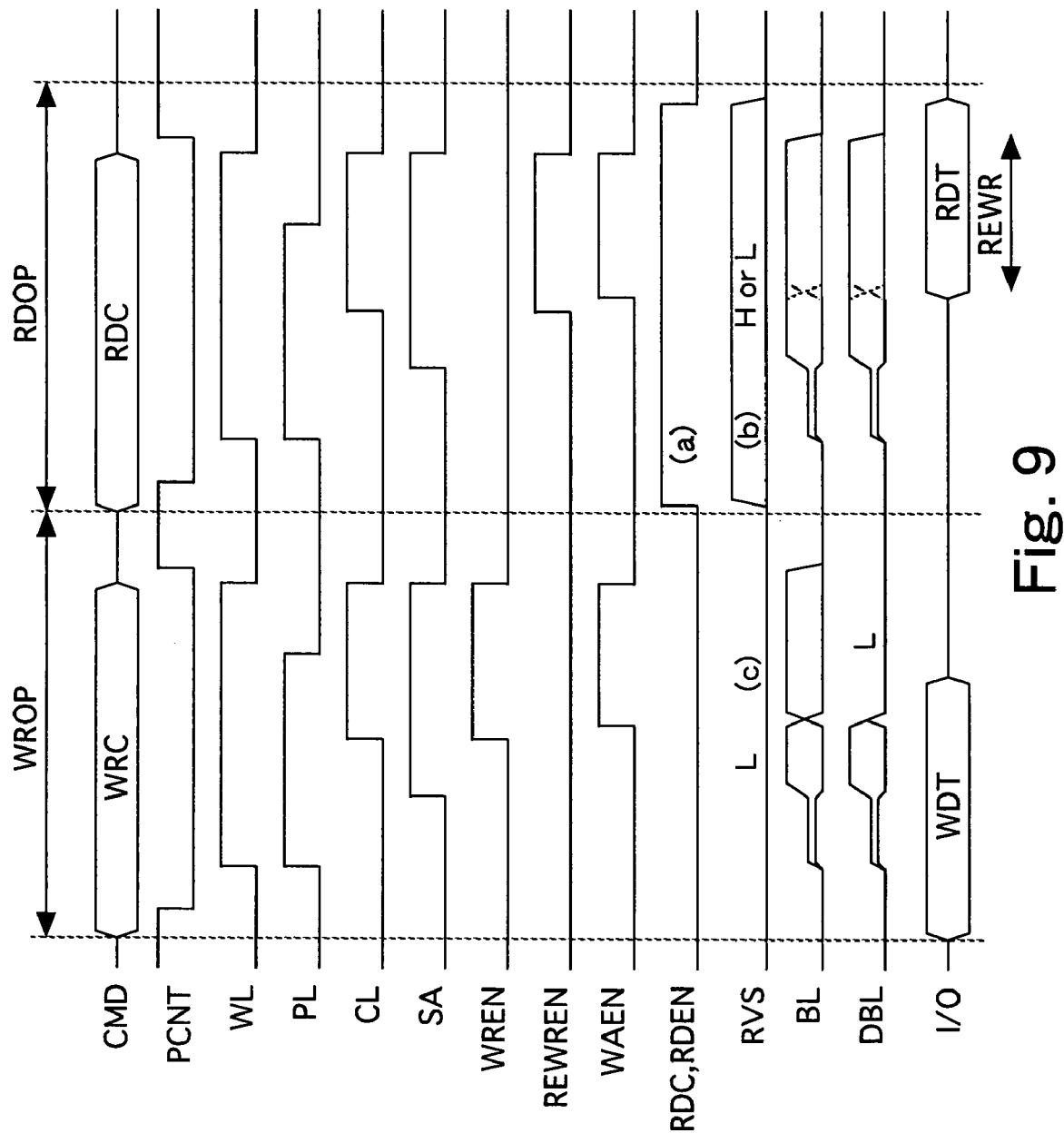
FIG. 9 is a timing diagram showing an example of operation of another embodiment.

FIG. 9 shows an example of operations of the embodiment on FIG. 8. Detailed explanations on the same operations as in the embodiment (FIG. 5) are omitted. Logic of the data signals to be inputted to/outputted from the memory cells MC, DMC are the same as in FIG. 6 described above.

The read command signal RDC is activated during a read operation period RDOP (FIG. 9(*a*)). The random-number generator RND stops to operate while the read enable signal RDEN is inactive, and connects the output of the random-number generator RND to the ground line. By operating the random-number generator RND only when necessary, power consumption in the ferroelectric memory can be reduced. The inversion control circuit INV receives a random-number signal RN at a low logical level while the read enable signal RDEN is inactive. Therefore, the inversion control circuit INV outputs the inverting signal RVS at a high logical level H or low logical level L only during the read operation period RDOP (FIG. 9(*b*)), and outputs the inverting signal RVS at a low logical level during other periods (FIG. 9(*c*)). In this embodiment, the inverting signal RVS is generated with a margin in synchronization with the read enable signal RDEN which is activated before the rewrite enable signal REWREN. Accordingly, the rewrite operation REWR in the write amplifiers WA, DWA is started with a margin. Specifically, the rewrite operation REWR can be executed in a short period of time.

As above, also in the embodiment on FIGS. 8-9, similar effects to those in the above-described embodiment on FIGS. 1-7 can be obtained. Moreover, in this embodiment, power consumption in the ferroelectric memory can be reduced by lowering the operation frequency of the random-number generator RND.

Figure 10:
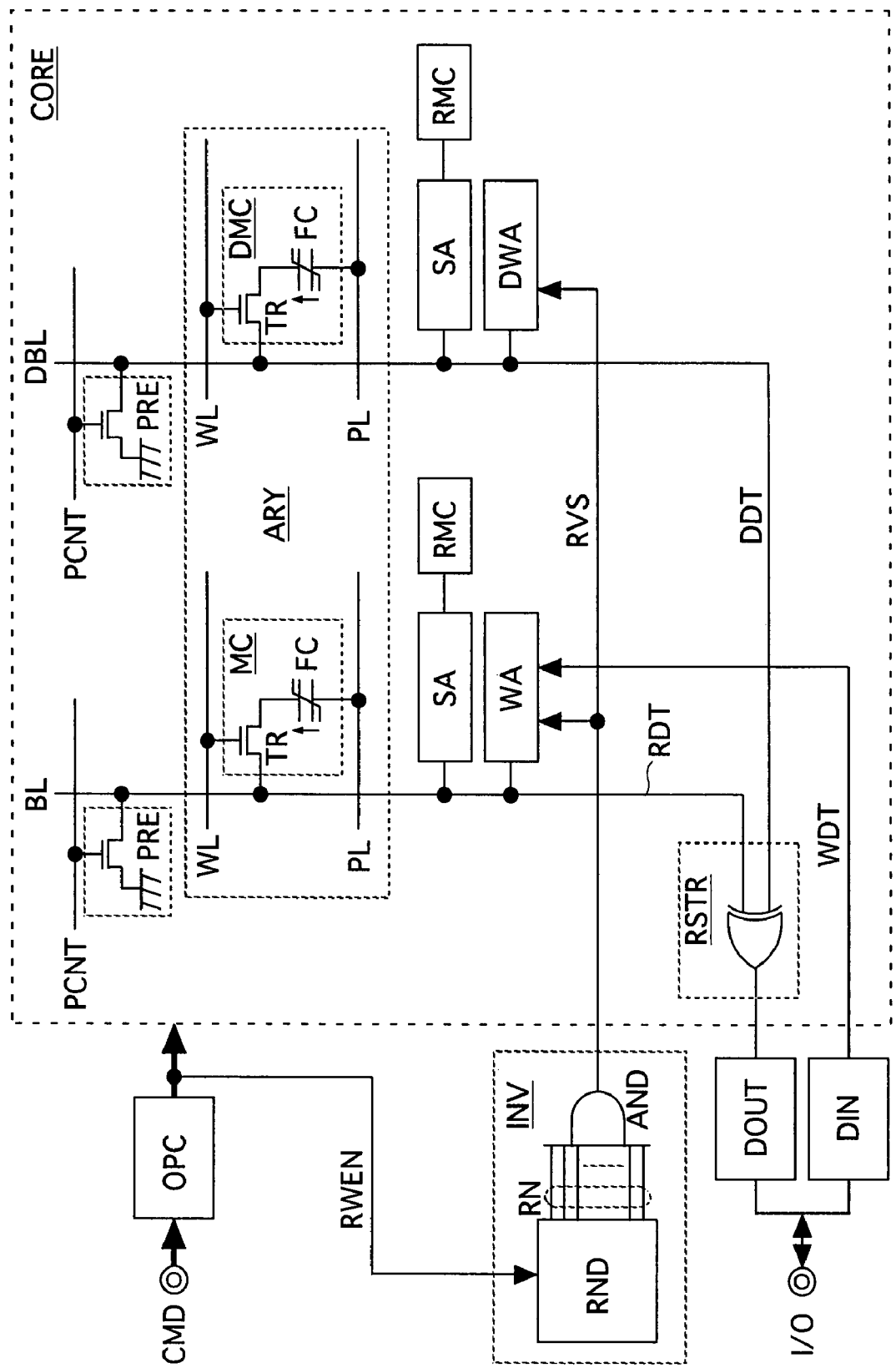
FIG. 10 is a block diagram showing another embodiment of the present invention.

FIG. 10 shows another embodiment of the present invention. The same elements as those explained in the embodiment on FIGS. 1-7 are designated the same symbols, and detailed explanations thereof are omitted. In this embodiment, the random-number generator RND is different from that of the embodiment on FIGS. 1-7. The other structure is the same as in the embodiment on FIGS. 1-7. The decision memory cell DMC is formed corresponding to at least one memory cell MC.

The random-number generator RND operates only during an active period of a read/write enable signal RWEN to generate a random-number signal RN. The read/write enable signal RWEN is outputted from the operation control circuit OPC in response to a command signal CMD (read command RDC or write command WRC) indicating a request for a read operation or a write operation. A probability that the random-number signal RN is activated to a high logical level (effective level) is set to, similarly to the embodiment on FIGS. 1-7, a value larger than 0 and smaller than 1. Each random-number generator RND stops to operate while the read/write enable signal RWEN is inactive, and connects the output of the random-number generator RND to the ground line. Accordingly, the random-number signal RN is fixed to a low logical level (invalid level). The inversion control circuit INV sets the inverting signal RVS to a valid level with a predetermined probability larger than 0 and smaller than 1 during a read operation and a write operation.

Figure 11:
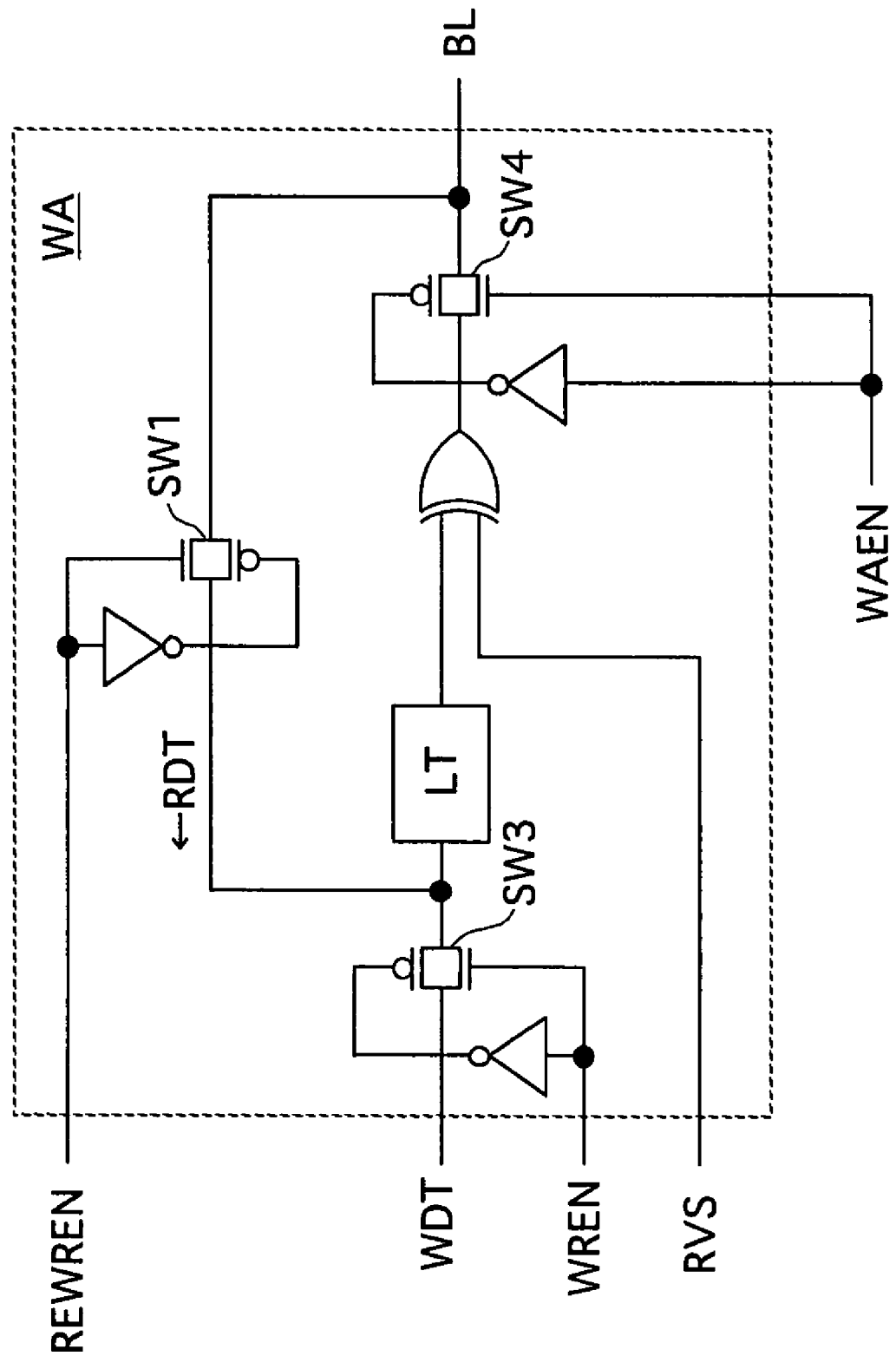
FIG. 11 is a block diagram showing details of a write amplifier WA shown in FIG. 10.

FIG. 11 shows details of a write amplifier WA shown in FIG. 10. The write amplifier WA of this embodiment is constructed by deleting the switch SW2 from the write amplifier WA of the embodiment on FIG. 2, and connecting the output of the switch SW3 to the input of the latch LT. The EOR circuit receives not only read data RDT (rewrite data) supplied via the switch SW1 but write data WDT received at the data terminal I/O, and performs a logical operation with the inverting signal RVS. Specifically, the write amplifier WA performs an EOR logical operation of the read data signal RDT read from the normal memory cells MC or the write data signal WDT supplied from the outside of the ferroelectric memory and the inverting signal RVS, and writes the logical value obtained by the operation to the normal memory cells MC via the switch SW4 and the bit line BL.

Figure 12:
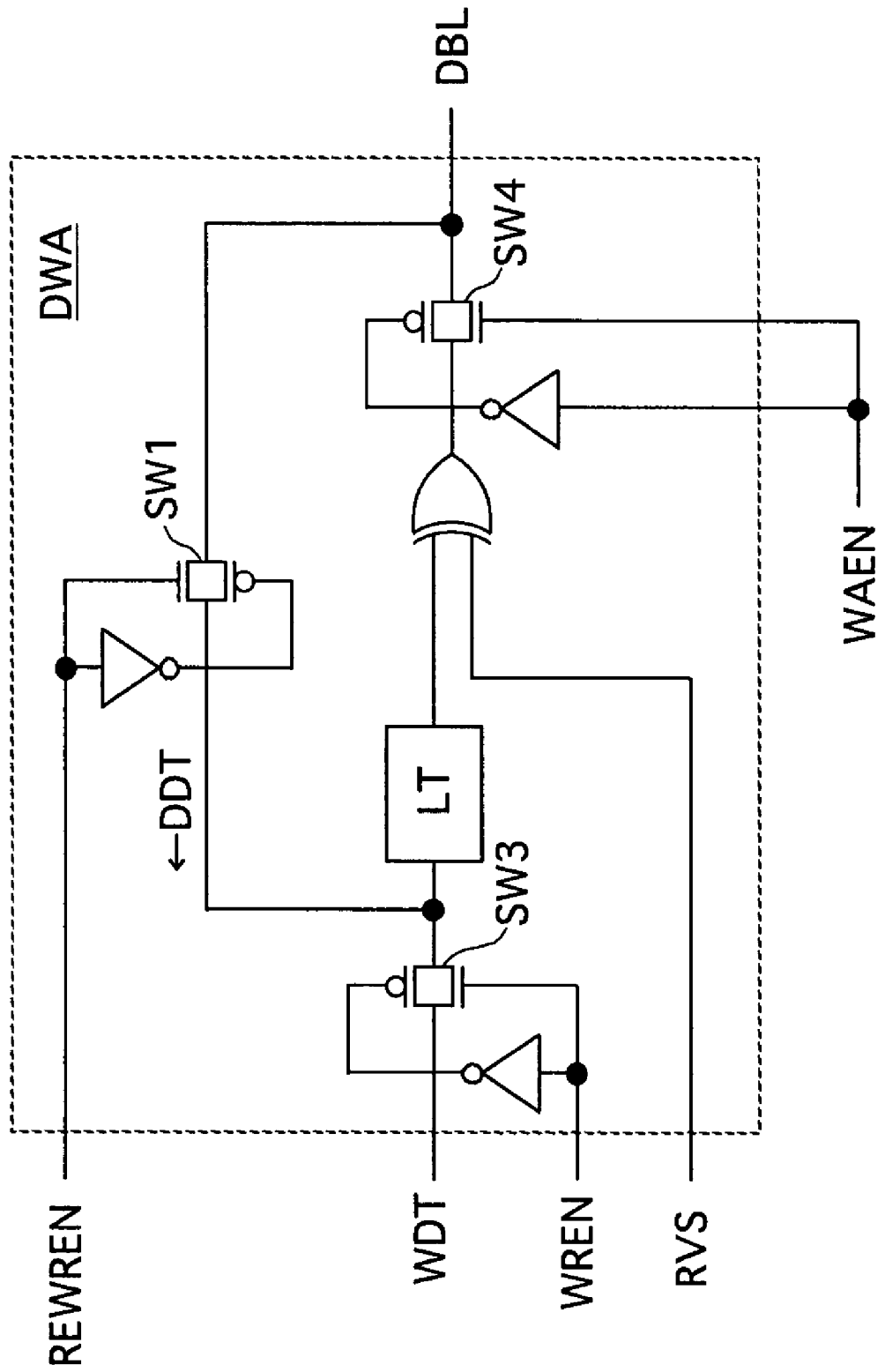
FIG. 12 is a block diagram showing details of a write amplifier DWA shown in FIG. 10.

FIG. 12 shows details of a write amplifier DWA shown in FIG. 10. The circuit structure of the write amplifier DWA in this embodiment is the same as the write amplifier WA in FIG. 11. By using the same design data for the write amplifiers WA, DWA, efficiency in design can be improved. The output of the switch SW4 is connected to the decision bit line DBL, and the switch SW1 transmits a decision data signal DDT to the latch LT. The EOR circuit receives not only the decision data signal DDT (rewrite data) supplied via the switch SW1 but write data WDT received at the data terminal I/O, and performs a logical operation with the inverting signal RVS. Specifically, the write amplifier DWA performs an EOR logical operation of the decision data signal DDT read from the decision memory cell DMC or the write data WDT supplied from the outside of the ferroelectric memory and the inverting signal RVS, and writes the logical value obtained by the operation to the normal memory cells MC via the switch SW4 and the bit line BL.

Figure 14:
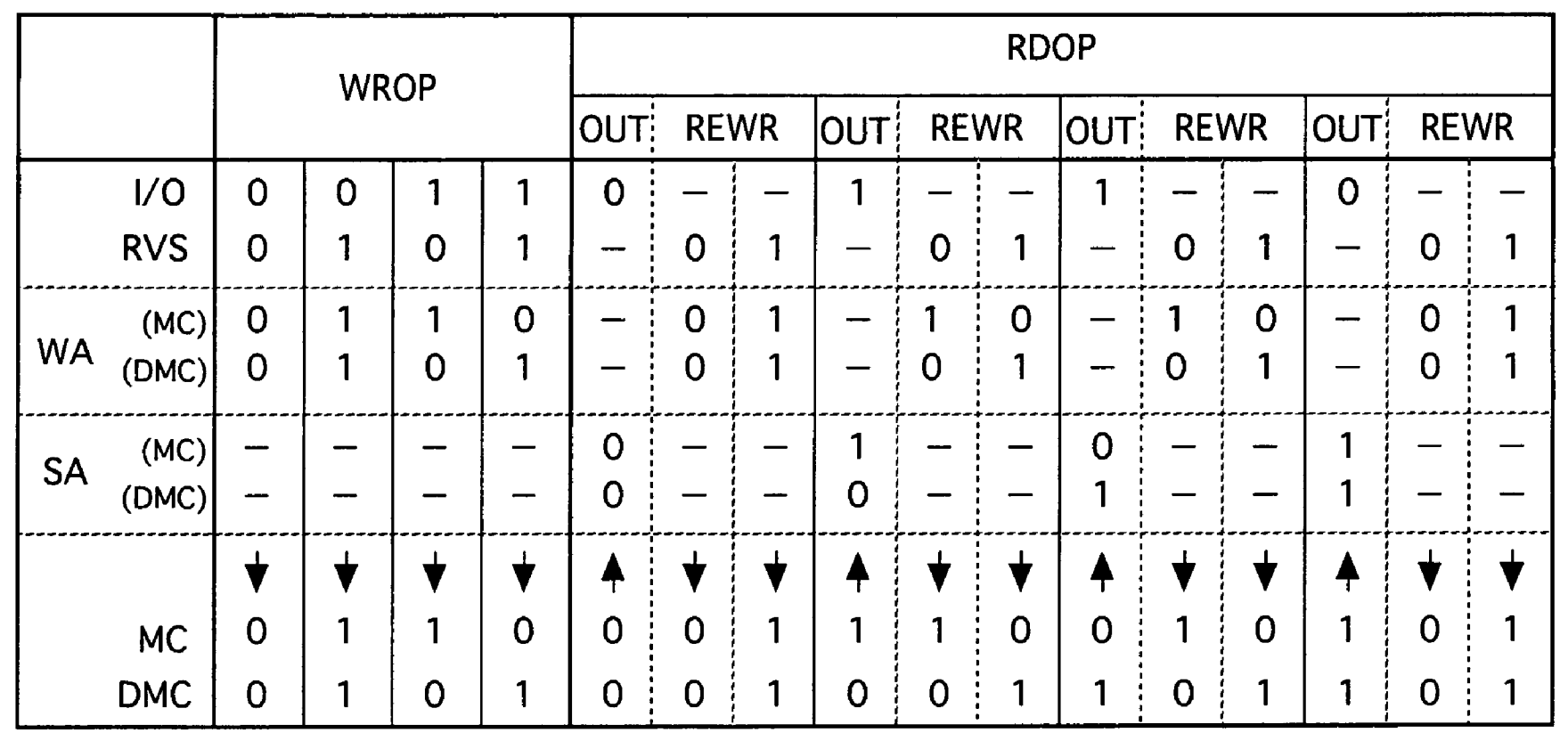

Note that as shown in FIG. 14 which will be described later, in the write operation WROP and the rewrite operation REWR, the logical level to be written to the decision memory cell DMC is always the same as the logical level of the inverting signal RVS. Accordingly, the switch SW1, the latch LT and the EOR gate may be deleted so as to supply the inverting signal RVS directly to the switch SW4.

Figure 13:
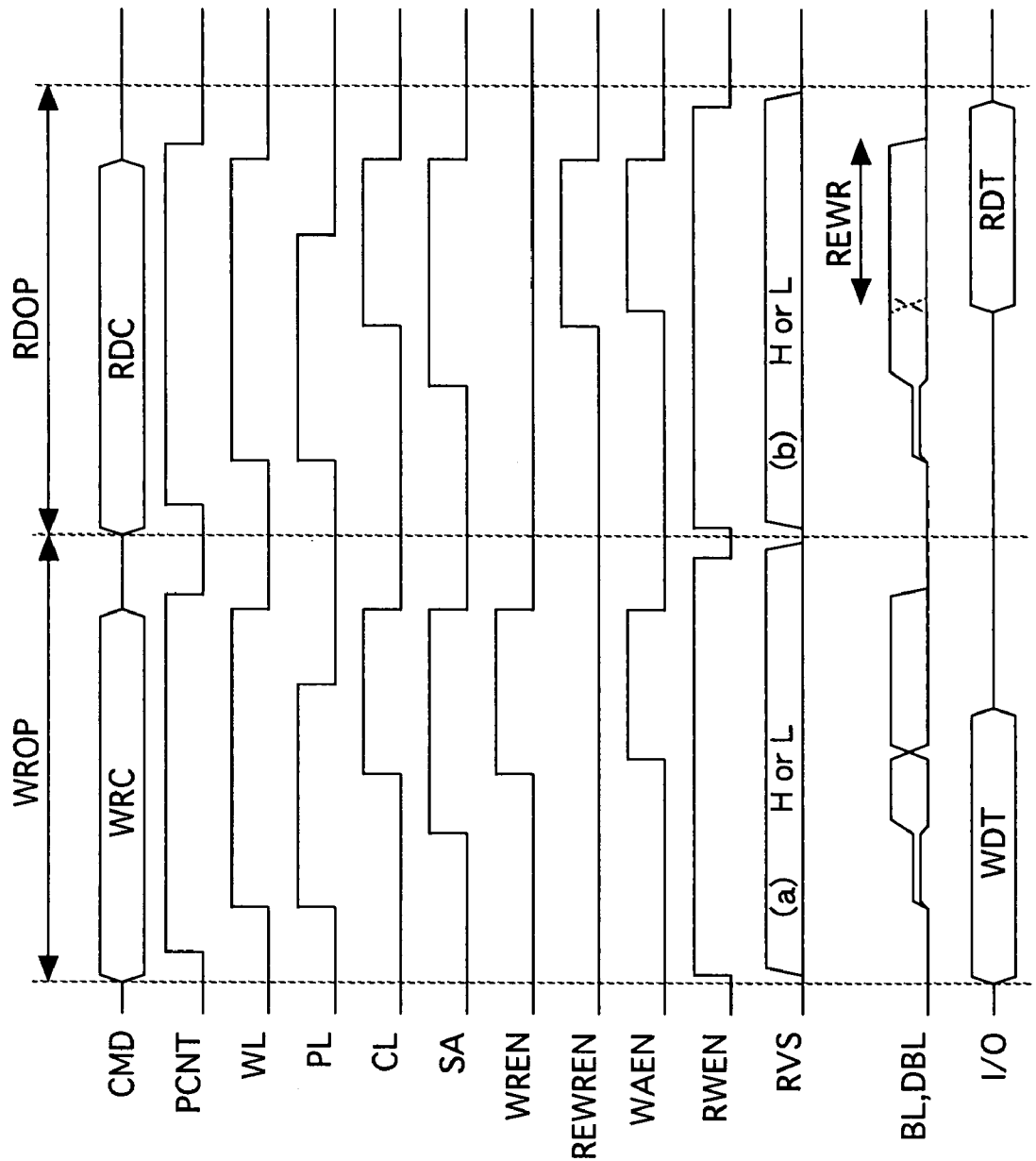
FIG. 13 is a timing diagram showing an example of operations of another embodiment shown in FIG. 10.

FIG. 13 shows an example of operations of the embodiment on FIGS. 10-12. Detailed explanations on the same operation as in the above embodiments (FIG. 5 and FIG. 9) are omitted. In this embodiment, the inverting signal RVS at a high logical level H or a low logical level L is generated in response to the read/write enable signal RWEN which is activated during the write operation WROP and the read operation RDOP (FIG. 13(a, b)). Accordingly, not only in the read operation RDOP but also in the write operation WROP, a decision data signal DDT according to the inverting signal RVS is written to the decision memory cell DMC.

FIG. 14 shows an overview of operations of the embodiment on FIG. 10-12. In the write operation WROP, the decision data signal DDT according to the inverting signal RVS is amplified in the write amplifier DWA, and is written to the decision memory cell DMC. The other operation in the write operation WROP and the read operation RDOP are the same as in FIG. 6 described above.

As above, also in the embodiment on FIGS. 10-14, similar effects to those in the above-described embodiments can be obtained. Moreover, in this embodiment, since the operation of the random-number generator RND is stopped during a standby period in which the access operations WROP, RDOP are not executed, the standby current in the ferroelectric memory can be reduced. Since circuits for the write amplifiers WA, DWA can be made common, efficiency in design can be improved. As a result, development costs for the ferroelectric memory can be reduced.

Figure 15:
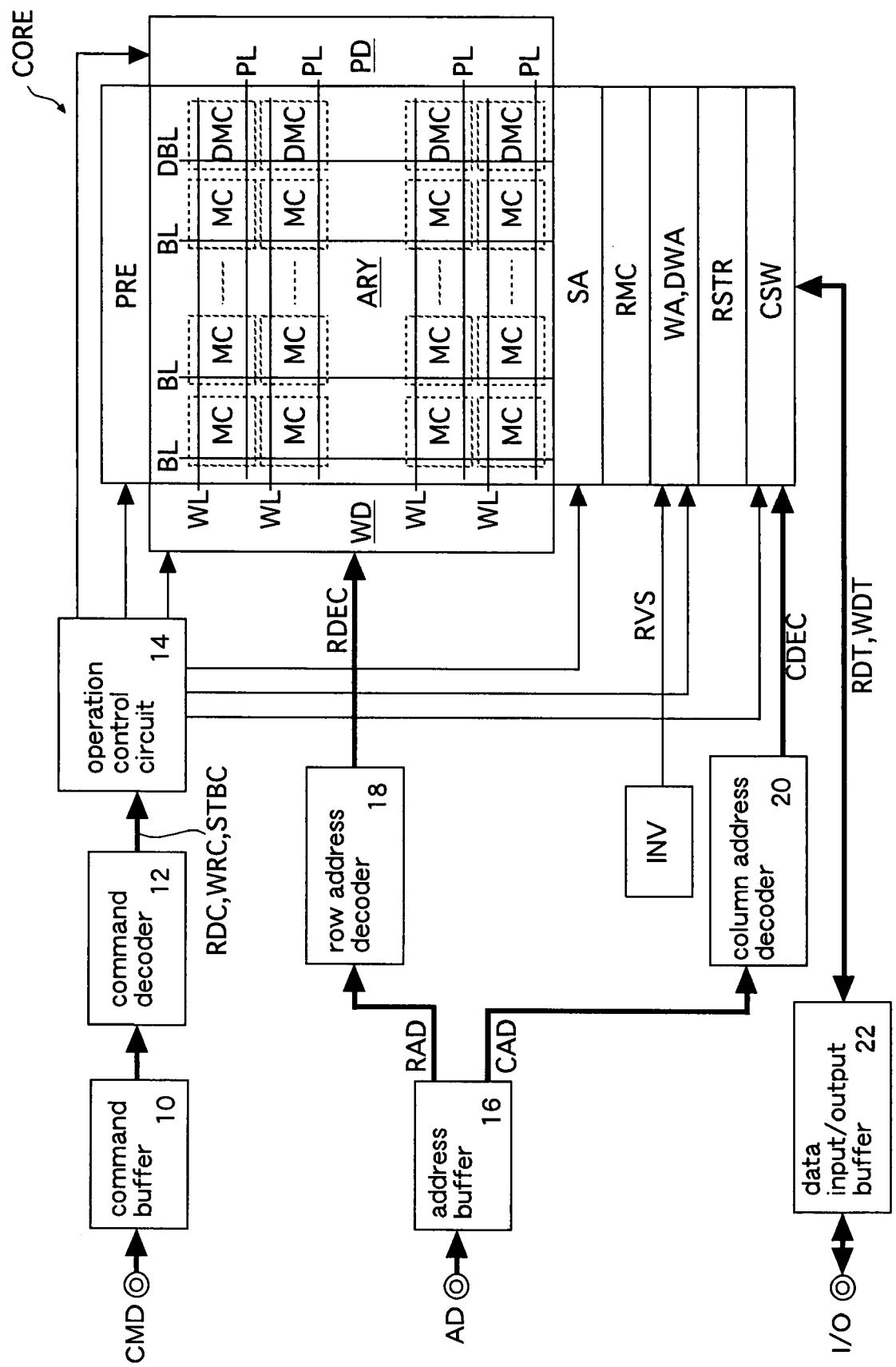
FIG. 15 is a block diagram showing another embodiment of the present invention.

FIG. 15 shows another embodiment of the present invention. The same elements as those explained in the embodiment on FIGS. 1-7 are designated the same symbols, and detailed explanations thereof are omitted. In this embodiment, a more specific example of a ferroelectric memory is shown. The ferroelectric memory is formed on a silicon substrate using CMOS process, and is mounted for example as a work memory on portable equipment (system) of a mobile phone or the like, or mounted on a wireless tag.

The ferroelectric memory has a command buffer 10, a command decoder 12, an operation control circuit 14, an address buffer 16, a row address decoder 18, a column address decoder 20, a data input/output buffer 22, a memory core CORE and the inversion control circuit INV of the embodiment on FIGS. 1 and 4.

The command buffer 10 receives a command signal CMD such as chip select signal, output enable signal, write enable signal, or the like via the command terminal CMD, and outputs it to the command decoder 12. The command decoder 12 decodes the command signal CMD and outputs a decoding result to the operation control circuit 14. Types of commands include read command RDC to read data stored in the memory cells MC, write command WRC to write data to the memory cells MC, and standby command STBC for not accessing the memory cells MC.

For example, when the chip select signal is activated and the write enable signal is inactivated, the read command RDC is recognized. At this time, by activating of the output enable signal, the read data signal RDT is outputted to the data terminal I/O. When the chip select signal and the write enable signal are activated, the write command WRC is recognized. At this time, the write data signal WDT received at the data terminal I/O is written to the memory cells MC. When the chip select signal is inactivated, the standby command STBC is recognized.

The operation control circuit 14 is a circuit corresponding to the operation control circuit OPC of the embodiment on FIG. 1. According to the output of the command decoder 12, the operation control circuit 14 generates a control signal to control operations of a word driver WD, a plate driver PD, a precharge circuit PRE, a sense amplifier SA, a write amplifier WA, a column switch CSW, a data input/output buffer 22, and so forth, so as to execute the read operation RDOP and the write operation WROP on the memory core CORE.

The address buffer 16 receives the address signal AD via the address terminal AD, and outputs high-order bits and low-order bits in the received address signal AD as a row address signal RAD and a column address signal CAD, respectively. The row address decoder 18 decodes the row address signal RAD to generate a decode signal RDEC, and outputs it to the word driver WD. The column address decoder 20 decodes the column address signal CAD to generate a decode signal CDEC, and outputs it to the column switch CSW.

The data input/output buffer 22 is a circuit corresponding to the data output circuit DOUT and the data input circuit DIN of the embodiment on FIG. 1. The data input/output buffer 22 outputs the write data signal WDT, which is received at the data terminal I/O according to a control signal (not shown) from the operation control circuit 14, to the column switch CSW, or outputs the read data signal RDT, which is received via the column switch CSW, to the data terminal I/O. The number of data terminals I/O is eight bits for example.

The memory core CORE has a memory cell array ARY, a word driver WD, a plate driver PD, a precharge circuit PRE, a sense amplifier SA, a reference memory cell RMC, a write amplifiers WA, DWA, a data restoration circuit RSTR and a column switch CSW. The precharge circuit PRE, the sense amplifier SA, the write amplifier WA, the reference memory cell RMC and the data restoration circuit RSTR are constructed by repetitively arranging the precharge circuit PRE, the sense amplifier SA, the write amplifier WA, the reference memory cell RMC and the data restoration circuit RSTR of the embodiment on FIG. 1 respectively, and operate by the same timing as in the embodiment on FIG. 1. Operation timing of the word driver WD, the plate driver PL and the column switch CSW is the same as the operation timing of the symbols WL, PL, CL in FIG. 5 described above.

The memory cell array ARY has a plurality of memory cells MC, DMC arranged in a matrix form, a plurality of word lines WL and plate lines PL connected to rows of the memory cells MC, DMC arranged in a lateral direction in the diagram, a plurality of bit lines BL connected to the memory cells MC arranged in a longitudinal direction in the diagram, and a decision bit line DBL connected to the decision memory cells DMC arranged in the longitudinal direction in the diagram. The memory cells MC, DMC are the 1T1C type, and have the same structure and electric characteristics as each other.

In this embodiment, the memory cells MC, DMC arranged in the lateral direction in the diagram are connected to common word lines WL and plate lines PL. In other words, one decision memory cell DMC is formed for every memory cell group (1 word), which is constituted of a predetermined number (1024 for example) of normal memory cells MC connected to one word line WL. By forming one decision memory cell DMC for every plurality of normal memory cells MC, the number of decision memory cells DMC can be minimized. Accordingly, the chip size of the ferroelectric memory can be made small. Further, by forming one decision memory cell DMC for every word line WL, the decision memory cells DMC can be easily arranged in the memory cell array ARY. Thus, it is not necessary to largely change a conventional layout for realizing the present invention. Consequently, the period of development of the ferroelectric memory can be shortened.

The word driver WD responds to a control signal from the operation control circuit 14 during the read operation RDOP and the write operation WROP to select a word line WL corresponding to the address signal AD (decode signal RDEC). Ferroelectric capacitors FC of the memory cells MC, DMC connected to the selected word line WL are connected to the bit lines BL, DBL respectively. In other words, when one of the word lines WL is selected by the address signal AD, not only the normal memory cells MC but also the decision memory cells DMC thereon are always accessed.

The data restoration circuit RSTR executes a restoration operation of the read data signal RDT upon reception of the decision data signal DDT outputted from a common decision memory cell DMC. Therefore, all the memory cells MC connected to one word line WL stores the same logical value (true data) as the write data signal WDT, or stores an opposite logical value (false data) to that of the write data signal WDT. In other words, it does not happen that true data and false data are stored in a mixed manner in a plurality of memory cells MC connected to one word line WL. The data restoration circuit RSTR is formed for every bit line BL for example.

The column switch CSW turns on according to the decode signal CDEC, and connects the output of the data restoration circuit RSTR to a data bus DB. Note that the column switch CSW may be connected to the bit lines BL, and the output of the column switch may be connected to the input of the data restoration circuit RSTR. In this case, the number of data restoration circuits RSTR may be the same as the number of data terminals I/O, which is eight.

Figure 16:
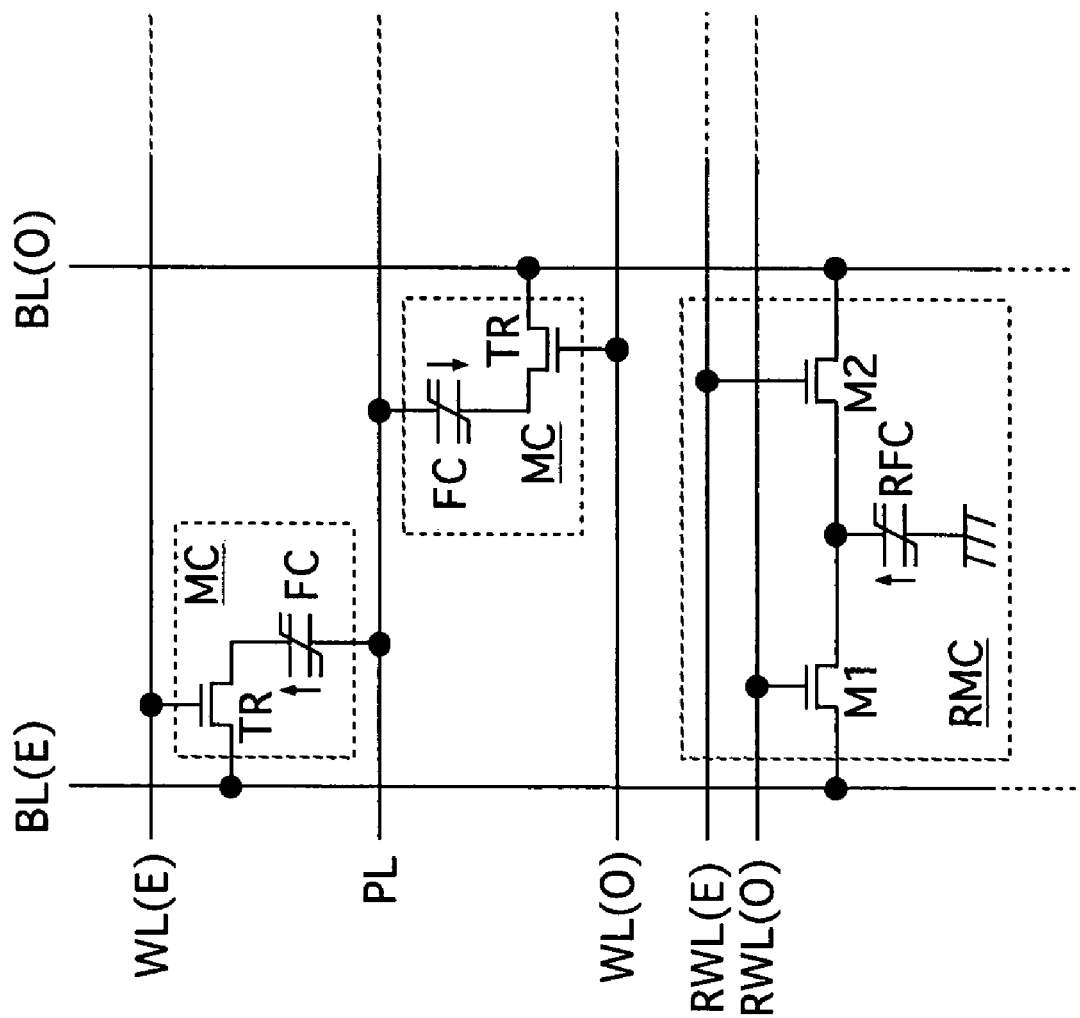
FIG. 16 is a circuit diagram showing a main part of a memory cell array shown in FIG. 15.

FIG. 16 shows a main part of the memory cell array ARY shown in FIG. 15. The memory cells MC are each constituted of one transfer transistor TR and one ferroelectric capacitor FC (1T1C type) for retaining information of one bit. One end of the ferroelectric capacitor FC is connected to a bit line BL(E) or BL(O) via the transfer transistor TR. The other end of the ferroelectric capacitor FC is connected to a plate line PL. The gate of the transfer transistor TR is connected to a word line WL(E) or WL(O).

The reference memory cell RMC connected to the pair of bit lines BL(E), BL(O) has a reference capacitor RFC constituted of a ferroelectric capacitor and two nMOS transistors M1, M2. The reference capacitor RFC has a capacitance value that is in between the capacitance value of a ferroelectric capacitor FC storing a logic 0 and the capacitance value of a ferroelectric capacitor FC storing a logic 1. The nMOS transistor M1 connects the reference capacitor RFC to the bit line BL(E) when a reference word line RWL(O) is at a high level. The nMOS transistor M2 connects the reference capacitor RFC to the bit line BL(O) when a reference word line RWL(E) is at a high level.

As above, also in the embodiment on FIGS. 15 and 16, similar effects to those in the above-described embodiment on FIGS. 1-7 can be obtained. Moreover, in this embodiment, the chip size of the ferroelectric memory can be made small by forming one decision memory cell DMC for every plurality of memory cells MC. Further, by connecting the memory cells MC, DMC having the same structures to each of the word lines WL, the decision memory cells DMC can be arranged easily without largely changing the layout of a conventional memory cell array ARY. Consequently, the period of development of the ferroelectric memory can be shortened.

Figure 17:
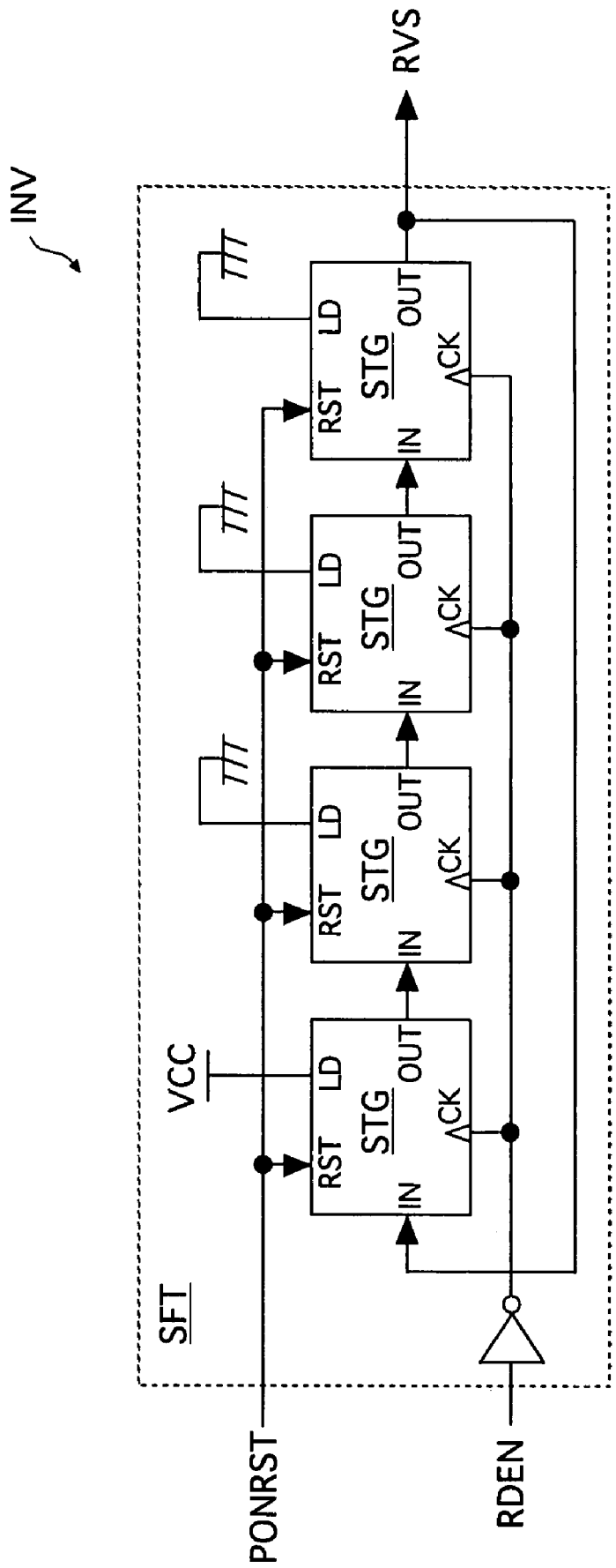
FIG. 17 is a circuit diagram showing an inversion control circuit according to another embodiment of the present invention.

FIG. 17 shows an inversion control circuit INV in another embodiment of the present invention. This inversion control circuit INV is used instead of the inversion control circuit INV in the embodiment on FIG. 8. The structure excluding the inversion control circuit INV is the same as in the embodiment on FIG. 8.

The inversion control circuit INV is constituted of a shift register SFT. The shift register SFT has four memory stages STG connected in series. Each memory stage STG has an input terminal IN, an output terminal OUT, a reset terminal RST, a load terminal LD and a clock terminal CK. The memory stage STG receives a logical level of the input terminal IN in synchronization with a rising edge of an inverting signal of a read enable signal RDEN (=falling edge of the RDEN signal) received at the clock terminal CK, and outputs the received logical level to the output terminal OUT. Further, the memory stage STG stores a logical level received at the load terminal LD during a high logical level period of a power on reset signal PONRST received at the reset terminal RST, and outputs the stored logical level to the output terminal OUT. The power on reset signal PONRST is a signal which changes to a high logical level only during a predetermined period when supplying of a power supply voltage to the ferroelectric memory is started. Thus, in this embodiment, the inversion control circuit INV is constituted of a simple logic circuit.

The load terminal LD in a first one of the memory stages STG is connected to a power supply line VCC. Load terminals LD in other memory stages STG are connected to a ground line VSS. Accordingly, the inverting signal RVS changes from a low logical level to a high logical level (inversion level) in response to completion of a third read operation RDOP after turning on of the ferroelectric memory. Then, until a third rewrite operation REWR, a signal having the same logic as a data signal read from the memory cells MC, DMC is rewritten to the memory cells MC, DMC. In a fourth rewrite operation REWR, a data signal having opposite logic to that of the data signal read from the memory cells MC, DMC is written to the memory cells MC, DMC. Thereafter, every four times the read operation is executed, inverted data is written to the memory cells MC, DMC in the rewrite operation REWR. In other words, in this embodiment, the probability that inverted data is written to the memory cells MC, DMC is 0.25.

Note that a read/write enable signal RWEN may be supplied instead of the read enable signal RDEN, and may be used instead of the inversion control circuit INV of the embodiment on FIG. 10. Moreover, an output signal from a timer may be supplied instead of the read enable signal RDEN, and may be used instead of the inversion control circuit INV of the embodiment on FIG. 1. In this case, the cycle of the output signal from the timer is set, for example, substantially equal to the cycles of the write operation WROP and the read operation RDOP of the ferroelectric memory. Alternatively, in the case where the ferroelectric memory is clock synchronization type, a clock signal or a clock signal having a divided frequency of the clock signal may be supplied instead of the read enable signal RDEN. In this case, the cycle of the clock signal supplied to the inversion control circuit INV is set substantially equal to the cycle of the write operation WROP and the read operation RDOP of the ferroelectric memory.

As above, in the embodiment on FIG. 17, similar effects to those in the above-described embodiments can be obtained. Moreover, in this embodiment, the inversion control circuit INV is constituted of a simple logic circuit. Consequently, the chip size of the ferroelectric memory can be made small. Further, since the logical scale of the inversion control circuit INV is small, power consumption of the inversion control circuit INV can be made small, and thus power consumption of the ferroelectric memory can be made small.

Here, in the above-described embodiments, examples of applying the present invention to a ferroelectric memory chip are explained. The present invention is not limited to such embodiments. For example, the present invention may be applied to a system LSI or a system chip on which a ferroelectric memory core is mounted.

In the embodiment on FIGS. 8 and 9, an example of stopping the operation of the random-number generator RND while the read enable signal RDEN is inactive is explained. The present invention is not limited to such an embodiment. For example, in the case where the ferroelectric memory has a terminal which validates access such as a chip select terminal or the like, the operation of the random-number generator RND can be stopped while the chip select signal supplied to the chip select terminal is inactive. Also in this case, the standby current of the ferroelectric memory can be reduced.

In the embodiment on FIGS. 15 and 16, an example of using the inversion control circuit INV of the embodiment on FIG. 1 is explained. The present invention is not limited to such an embodiment. For example, the inversion control circuits INV of the embodiment on FIG. 8 or 10 may be used to realize the present invention.

In the embodiment on FIGS. 15 and 16, an example of forming the decision memory cell DMC for every word line WL is explained. The present invention is not limited to such an embodiment. For example, one decision memory cell DMC may be formed in the memory cell array ARY. In this case, it is necessary for every read operation that data in all the memory cells MC are rewritten according to the inverting signal RVS. Accordingly, it is effective when applied to a system in which all the memory cells MC are accessed by one read command.

A proposition of embodiments is to prevent occurrence of imprint in a ferroelectric capacitor and deterioration of characteristics thereof to thereby improve reliability of a ferroelectric memory.

In an embodiment, normal memory cells each have a ferroelectric capacitor and store data written via an external terminal. A nonvolatile decision memory unit stores decision data indicating whether data stored in the normal memory cells is true or false. An operation control circuit controls a write operation, a read operation, and a rewrite operation on the normal memory cells and the decision memory unit, the rewrite operation being executed in a latter half of the read operation. An inversion control circuit outputs an inverting signal and sets the inverting signal to a valid level with a predetermined probability larger than 0 and smaller than 1 at least during the rewrite operation. A write circuit writes, at least during the rewrite operation, data having logic which is an inverse of logic of data to be rewritten to the normal memory cells and writes decision data indicating false to the decision memory unit when the inverting signal indicates a valid level. The write circuit writes data having logic to be rewritten to the normal memory cells and writes decision data indicating true to the decision memory unit when the inverting signal does not indicate a valid level. A data restoration circuit inverts and outputs, during a read operation, logic of data read from the normal memory cells when decision data indicating false is read from the decision memory unit, and outputs data read from the normal memory cells when decision data indicating true is read from the decision memory unit.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A ferroelectric memory, comprising:
    a plurality of normal memory cells each having a ferroelectric capacitor and storing data written via an external terminal;
    a nonvolatile decision memory unit storing decision data indicating whether data stored in said normal memory cells is true or false;
    an operation control circuit controlling a write operation, a read operation, and a rewrite operation on said normal memory cells and said decision memory unit, the rewrite operation being executed in a latter half of the read operation;
    an inversion control circuit outputting an inverting signal and setting the inverting signal to a valid level with a predetermined probability larger than 0 and smaller than 1 at least during said rewrite operation;
    a write circuit writing, at least during said rewrite operation, data having logic which is an inverse of logic of data to be rewritten to said normal memory cells and writing decision data indicating false to said decision memory unit when said inverting signal indicates a valid level, and writing data having logic to be rewritten to said normal memory cells and writing decision data indicating true to said decision memory unit when said inverting signal does not indicate a valid level; and
    a data restoration circuit inverting and outputting, during a read operation, logic of data read from said normal memory cells when decision data indicating false is read from said decision memory unit, and outputting data read from said normal memory cells when decision data indicating true is read from said decision memory unit.

2. The ferroelectric memory according to claim 1, wherein said write circuit performs an EOR logical operation of read data read from said normal memory cells and said inverting signal, and rewrites an operation result to said normal memory cells.

3. The ferroelectric memory according to claim 1, wherein said inversion control circuit operates only during a read operation period so as to set said inverting signal to a valid level with a predetermined probability, and fixes said inverting signal to an invalid level during other periods.

4. The ferroelectric memory according to claim 1, wherein said inversion control circuit sets said inverting signal to a valid level with a predetermined probability larger than 0 and smaller than 1 during said rewrite operation and said write operation.

5. The ferroelectric memory according to claim 4, wherein said inversion control circuit operates only during a write operation period and a read operation period so as to set said inverting signal to a valid level with a predetermined probability, and fixes said inverting signal to an invalid level during other periods.

6. The ferroelectric memory according to claim 4, wherein said write circuit performs an EOR logical operation of read data read from said normal memory cells or write data supplied from an outside of the ferroelectric memory and said inverting signal, and writes an operation result to said normal memory cells.

7. The ferroelectric memory according to claim 1, wherein said decision memory unit is formed for every predetermined number of said normal memory cells.

8. The ferroelectric memory according to claim 7, further comprising a word line connected to said predetermined number of the normal memory cells, wherein said decision memory unit has a same structure as the normal memory cell, and is constituted of a decision memory cell connected to said word line.

9. The ferroelectric memory according to claim 1, wherein said inversion control circuit comprises:
    at least one random-number generator outputting a random-number signal having a first logical level with a predetermined probability larger than 0 and smaller than 1; and
    a logic circuit setting said inverting signal to a valid level when all of said random-number generators output a random-number signal having the first logical level.

10. The ferroelectric memory according to claim 1, wherein
    said normal memory cells are each constituted of one transfer transistor and one said ferroelectric capacitor.

11. An operating method of a ferroelectric memory which comprises a plurality of normal memory cells each having a ferroelectric capacitor and storing data written via an external terminal and a nonvolatile decision memory unit storing decision data indicating whether data stored in said normal memory cells is true or false, the method comprising:
    setting an inverting signal to a valid level with a predetermined probability larger than 0 and smaller than 1 at least during a rewrite operation executed in a latter half of a read operation;
    writing, at least during said rewrite operation, data having logic which is an inverse of logic of data to be rewritten to said normal memory cells and writing decision data indicating false to said decision memory unit when said inverting signal indicates a valid level;
    writing data having logic to be rewritten to said normal memory cells and writing decision data indicating true to said decision memory unit when said inverting signal does not indicate a valid level; and
    inverting and outputting, during a read operation, logic of data read from said normal memory cells when decision data indicating false is read from said decision memory unit, and outputting data read from said normal memory cells when decision data indicating true is read from said decision memory unit.

12. The operating method of the ferroelectric memory according to claim 11 wherein the method further comprises:
    performing an EOR logical operation of read data read from said normal memory cells and said inverting signal; and
    rewriting an operation result to said normal memory cells.

13. The operating method of the ferroelectric memory according to claim 11 wherein the method further comprises:
    setting said inverting signal to a valid level with a predetermined probability only during a read operation period; and
    fixing said inverting signal to an invalid level during other periods.

14. The operating method of the ferroelectric memory according to claim 11 wherein the method further comprises:
    setting said inverting signal to a valid level with a predetermined probability larger than 0 and smaller than 1 during said rewrite operation and said write operation.

15. The operating method of the ferroelectric memory according to claim 14 wherein the method further comprises:
    setting said inverting signal to a valid level with a predetermined probability only during a write operation period and a read operation period; and fixing said inverting signal to an invalid level during other periods.

16. The operating method of the ferroelectric memory according to claim 14 wherein the method further comprises:
performing an EOR logical operation of read data read from said normal memory cells or write data supplied from an outside of the ferroelectric memory and said inverting signal; and
rewriting an operation result to said normal memory cells.

* * * * *